(12) United States Patent
Grayson et al.

(10) Patent No.: US 8,829,324 B2
(45) Date of Patent: Sep. 9, 2014

(54) ANISOTROPIC AMBIPOLAR TRANSVERSE THERMOELECTRICS AND METHODS FOR MANUFACTURING THE SAME

(71) Applicant: Northwestern University, Evanston, IL (US)

(72) Inventors: Matthew Grayson, Evanston, IL (US); Chaunle Zhou, Evanston, IL (US)

(73) Assignee: Northwestern University, Evanston, IL (US)

( * ) Notice: Subject to any disclaimer, the term of this patent is extended or adjusted under 35 U.S.C. 154(b) by 61 days.

(21) Appl. No.: 13/735,373

(22) Filed: Jan. 7, 2013

(65) Prior Publication Data

US 2013/0174884 A1 Jul. 11, 2013

Related U.S. Application Data

(60) Provisional application No. 61/584,041, filed on Jan. 6, 2012.

(51) Int. Cl.
*H01L 35/00* (2006.01)
*H01L 37/00* (2006.01)
*H01L 35/34* (2006.01)
*H01L 35/30* (2006.01)
*H01L 35/20* (2006.01)
*H01L 21/00* (2006.01)
*H01L 35/26* (2006.01)
*H01L 21/18* (2006.01)
*H01L 35/18* (2006.01)
*H01L 35/28* (2006.01)

(52) U.S. Cl.
CPC .............. *H01L 35/28* (2013.01); *H01L 35/26* (2013.01); *H01L 21/18* (2013.01); *H01L 35/18* (2013.01)

USPC .......... 136/200; 136/201; 136/203; 136/240; 438/54

(58) Field of Classification Search
None
See application file for complete search history.

(56) References Cited

PUBLICATIONS

Razeghi, M.; Wei, Y.; Hood, A.; Hoffman, D. ; Nguyen, B.M.; Delaunay. P.Y.; Michel, E.; McClintock, R, Type II Superlattice P!Jotodetectors for MWIR to VLWIR Focal Plane Arrays!. Infrared Technology and Applications XXXII, Proc. of SPIE vol. 6206, 62060 N, (2006), 7 pgs.
Cahill, David G.; Katiyar. M.; Abelson. J.R.: "thermal conductivity of a-Si:H thin films", Department of Materials Science and Engineering. Materials Research Laboratory, and Coordinated Science Laboratory, University of Illinois. Urbana, Illinois; vol. 50. No. 9, 1994 The American Physical Society, 6 pgs.

(Continued)

*Primary Examiner* — Eli Mekhlin
(74) *Attorney, Agent, or Firm* — Klintworth & Rozenblat IP LLC

(57) ABSTRACT

A transverse thermoelectric device includes a superlattice body, electrically conductive first and second contacts, and first and second thermal contacts. The superlattice body extends between opposite first and second ends along a first direction and between opposite first and second sides along a different, second direction. The superlattice body includes alternating first and second layers of crystalline materials oriented at an oblique angle relative to the first direction. The electrically conductive first contact is coupled with the first end of the superlattice and the electrically conductive second contact is coupled with the second end of the superlattice. The first thermal contact is thermally coupled to the first side of the superlattice and the second thermal contact is thermally coupled to the second side of the superlattice. A Seebeck tensor of the superlattice body is ambipolar.

18 Claims, 8 Drawing Sheets

(56) References Cited

PUBLICATIONS

Cahill, David G.: "thermal conductivity measurement from 30 to 750 K: the 3w method", AIP Review of Scientific Instruments, Rev. Sci. Instrum. 61. 802 (1990), 8 pgs.

Capinski, W.S.; Maris. H.J. et al.: "Thermal-conductivity measurements of GaAs/AlAs superlattices using a picosecond optical pump-and-probe technique", The American Physical Society, 1999, vol. 59, No. 12, 9 pgs.

Rowe. D.M., Thermoelectrics Handbook: Macro to Nano, Chapter 45. CRC Press (2006).

O'Brien, B.J.; Wallace, C.S. and Lan Decker, K., J.; "Cascading of Peltier Couples for Thermoelectric Cooling", Journal of Applied Physics. vol. 27, No. 7. Jul. 1956; p. 820-823.

Cuff, K.F.; Horst, R.B.; Weaver, J.L.; Hawkins, S.R.; Kooi, C.F.; and Enslow. G.M.; "The Thermomagnetic Figure of Merit and Ettingshausen Cooling in BiSb Alloys", Appl. Phys. Lett. 2. 145 (1963) 3 pgs.

Babin, V.P.; Gudkin, T.S.; Dashevskii, Z.M.; Dudkin, L.D.; Lordanishvili, E.K.; Kaidanov, V.I.; Kolomoets, N.V.; Narva, O.M.; Stilbans, L.S.; "Anisotropic synthetic thermoelements and their maximum capabilities"; Soy. Phys. Sennicond., vol. 8, No. 4, Oct. 1971; pp. 478-481.

Goldsmid, H.J.; "Application of the Transverse Thermoelectric Effects", Journal of Electronic Materials, vol. 40, No. 5, (2011), pp. 1254-1259.

Reitmaier, C.; Walther. F.; Lengfellner. H.; "Transverse thermoelectric devices", Appl. Phys. A 99. 717 (2010). pp. 717-722.

Mann, B.S.; "Transverse Thermoelectric Effects for Cooling and Heat Flux Sensing", Master Thesis, Virginia Tech. (2006). 120 pgs.

Kyarad. A; Lengfellner, H.; "Transverse Peltier effect in titled Pb-Bi2Te3 multilayer structures", Appl. Phys. Lett. 87, 182113 (2005), 4 pgs.

Kyarad, A.; Lengfellner. H.; "Angle-dependent photovoltaic effect in Al-Si multilayers", Appl. Phys. Lett. 89, 192103 (2006), 4 pgs.

Kooi, C.F.; Horst. R.B.; Cuff. K.F.; Hawnins. S.R.;"Theory of the Longitudinally Isothermal Ettingshausen Cooler". Appl. Phys. 34, 1735 (1963), 9 pgs.

Sai-Halasz, G.A.; Esaki, L.; Harrison, W.A.; "InAs-GaSb superlattice energy structure and its semiconductor-semimetal transition", Phys. Rev. 8 18, 2812 (1978), 7 pgs.

Nguyen, B. M.; Hoffman, D.; Delaunay, P.Y.; Razeghi, M.; "Dark current suppression in type II InAs/GaSb superlattice long wavelength infrared photodiodes with M-structure barrier". Appl. Phys. Lett. 91, 163511 (2007), 4 pgs.

Chambers, R.G.; "Electrons in Metals and Semiconductors," Chapters 9 and 10, Chapman and Hall (1990.

Khoshakhlagh, A.; Jaeckel, F.; Hains, C.; Rodriguez, J.B.; Dawson, R.; Malloy, K.; Krishna, S.; "Background carrier concentration in midwave and longwave InAs/GaSb lype II superlatlices on GaAs substrate", Appl. Phys. Lett. 97, 051109 (2010), 4 pgs.

Nextnano3 available at http://www.nextnano.de, Apr. 23, 2014.

Grein, C.H.; Young, P.M.; Flatie, M.E.; Ehrenreich. H.; "Long wavelength InAs/InGaSb infrared detectors: Optimization of carrier lifetimes", J. Appl. Phys. 78 (12). 7143 (1995), 11 pgs.

Zhou. C.; Nguyen, B.M.; Grayson. M.; "Thermal Conductivity of InAs/GaSb Type II Superlattice". J. Electron. Mater .. 41, 2322 (2012). 4 pgs.

Scholz, K.; Jandl, P.; Birkholz, U.; Dashevskii, Z.M.; "In finite stage Ettingshausen cooling in BiSb alloys", J. Appt. Phys. 75, 5407 (1994), 4 pgs.

Kanno. T.; Yotsuhashi, S.; Adachi, H.; Appl. Phys. Lett. 85, 739 (2004).

Chowdhury, 1.; Prasher, R.; Lofgreen, K.; Chrysler, G.; Narasimhan, S.; Mahajan, R.; Koester, D.; Alley, R.; Venkatasubramanian, R.; "On-chip cooling by superlattice-based thinfilm thermoelectrics", Nat. Nanotechnol. 4, 235 (2009), 4 pgs.

Steenbergen, E.H.; Cellek, O.O..; Lubyshev, D.; Qiu, Y.: Fastenau J.M.: Liu, A.W.K; Zhang. Y.H.; "Study of the valence band offsets between InAs and InAs1-xSbx alloys", Proc. of SPIE 8268 82680K (2012). 9 pgs.

Ong, K.P.; Singh, D.J.; Wu, P.; "Unusual Transport and Strongly Anisotropic Thermopower in PtCoO2 and PdCoO2", Phys. Rev. Lett. 104, 176601 (2010), 4 pgs.

He, Z.H.; Ma, Z.G.; Li, O.Y.; Luo, Y.Y; Zhang. J.X.; Meng, R.L.; Chu, C.W.; "Investigation of transverse Peltier effect on topseeded melt texture YBa2Cu3O7-0", Appl. Phys. Lett. 69 3587, (1996), 4 pgs.

Zhao, K.; Jin, K.J.: Huang. J.H.; Lu, H.B.; He. M.; Chen, Z. H.; Zhou. Y.L.; Yang, G.Z.; Laserinduced ultrafast photovoltaic effect in La0.67Ca0.33MnO3 films at room temperature, Physica B 373 72 (2006), 4 pgs.

Tang, G.D.; Guo, H.H.; Yang, T.; Zhang, D.W.; Xu, X.N.; Wang, L.Y.; Wang, Z.H.; Wen, H.H.; Zhang, Z.D.; Du, Y.W.; "Anisotropic thermoelectric properties in layered cobaltite AxCoO2 (A=Sr and Ca) thin films". Appl. Phys. Lett. 98, 2021 09 (2011), 4 pgs.

Goldsmid, H. J., "Introduction to Thermoelectricity," Chapter 11 (2010).

ANISOTROPIC AMBIPOLAR TRANSVERSE THERMOELECTRICS AND METHODS FOR MANUFACTURING THE SAME

CROSS-REFERENCE TO RELATED APPLICATIONS

This application claims priority to U.S. Provisional Application No. 61/584,041, which was filed on 6 Jan. 2012 (the "'041 Application"). The entire disclosure of the '041 Application is incorporated by reference.

STATEMENT REGARDING FEDERALLY SPONSORED RESEARCH & DEVELOPMENT

This invention was made with Government support under FA9550-09-1-0237 and FA9550-12-1-0169 awarded by the Air Force Office of Scientific Research, and DMR0520513 and DMR-0748856 awarded by the National Science Foundation. The Government has certain rights in the invention.

BACKGROUND

Products and methods relating to transverse thermoelectric materials and devices are disclosed herein.

Some known longitudinal thermoelectric devices include extrinsically doped p- or n-type materials. Electric current can be applied to these longitudinal thermoelectric devices in order to cause heat to flow along the same axis as the electrical current (e.g., parallel or anti-parallel to the current flow) throughout the entirety of the longitudinal thermoelectric devices.

The use of such longitudinal thermoelectric devices may be restricted since the dopants in semiconductor materials of the devices may freeze out at relatively low temperatures. For example, the dopants may fail to ionize or produce charge carriers (e.g., electrons and/or holes) for conduction in the semiconductor materials at relatively low temperatures.

Additionally, the efficiency of these devices in cooling objects may be limited. For example, in order to achieve sufficient cooling of a target object, both n-type and p-type longitudinal thermoelectric materials may be required for each device, and a cascade of multiple devices in parallel and in series may be needed to achieve large temperature differences. The required use of several pieces of such materials for each device, and of several devices in cascaded layers to achieve large thermal differences can limit the use and/or efficacy of the devices in cooling objects that are in relatively small or tight locations, such as in computing devices.

Some known transverse thermoelectric devices include Nernst-Ettinghausen effect (N-E) devices and Stacked-Synthetic (S-S) devices. In N-E devices, an external magnetic field is applied to a semimetal in order to cause heat flow along an axis that is transverse to the electrical current.

One disadvantage of some known N-E devices is the need to apply a large, uniform magnetic field. This makes the use of such devices impractical in most applications due to the need to surround such devices with a large electromagnet. Moreover, the transverse thermoelectric effect in such devices may be too small to compete with longitudinal thermoelectric effect devices at room temperature. Therefore, such devices are only employed at low temperatures (e.g., 100 K-150 K), and where the application can tolerate a large external electromagnet (e.g, 1.5 T).

In some known S-S devices, millimeter sized slabs of extrinsically-doped semiconductor having a large Seebeck coefficient are alternated with a slabs of metals (or semimetals) having large electrical and thermal conductivity. When an electrical current is applied to such devices, heat flows along an axis that is transverse to the applied current.

Disadvantages of S-S devices include a limitation that the devices may only be manufactured on a macroscopic scale, and the devices can be limited to only perform at temperatures where standard longitudinal thermoelectrics already provide superior performance. Because S-S devices are made of millimeter-thick slabs, the devices may need to be of the scale of centimeters or larger. It may be too technically challenging and labor intensive to thin such slabs and then assemble the slabs to try to manufacture a sub-millimeter scale device, and no known attempt appears to have been made thus far. Thus, such materials may be restricted to macroscopic devices. Since one of the layers is an extrinsically doped semiconductor, however, S-S devices may lose functionality at the same temperatures as macroscopic longitudinal thermoelectrics. For at least this reason, some known S-S devices have not offered a significant useful performance advantage over longitudinal thermoelectric devices, and have remained a laboratory curiosity.

BRIEF DESCRIPTION

In one embodiment, a transverse thermoelectric device includes a superlattice body, electrically conductive first and second contacts, and first and second thermal contacts. A superlattice can include a crystalline structure of repeating layers of two or more materials. Elements at the boundary between two different layers in the superlattice are covalently bonded such that multiple repeating layers form one crystal. The layers are typically thinner than the scattering lengths of electrons, holes, and phonons. In one embodiment, a superlattice does not include non-covalent layered materials such as stacked synthetic thermoelectrics. The superlattice body extends between opposite first and second ends along a first direction and between opposite first and second sides along a different, second direction. The superlattice body includes alternating first and second layers of crystalline materials oriented at an oblique angle relative to the first direction. The electrically conductive first contact is coupled with the first end of the superlattice and the electrically conductive second contact is coupled with the second end of the superlattice. The first thermal contact is thermally coupled to the first side of the superlattice and the second thermal contact is thermally coupled to the second side of the superlattice. A Seebeck tensor of the superlattice body is ambipolar.

In one embodiment, a method for manufacturing a transverse thermoelectric device includes providing alternating first and second layers of semiconductor materials to form a superlattice body extending between opposite first and second ends along a first direction, and between opposite first and second sides along a different, second direction. The superlattice body includes alternating first and second layers of crystalline materials oriented at an oblique angle relative to the first direction. The method also includes coupling a first electrically conductive contact with the first end of the superlattice body, coupling a second electrically conductive contact with the second end of the superlattice body, coupling a first thermal contact to the first side of the superlattice body, and coupling a second thermal contact to the second side of the superlattice body. The alternating first and second layers are oriented at an oblique angle relative to the first direction and a Seebeck tensor of the superlattice body is ambipolar.

In one embodiment, a transverse thermoelectric cooling device includes a semiconductor body, an electrically conductive receiving contact, an electrically conductive injecting contact, a thermally conductive side facet for heat absorption, and a thermally conductive side facet for heat rejection. The semiconductor body extends between opposite first and second ends and includes alternating first and second layers of semiconductor materials oriented at an oblique angle relative to the injected current flow. The receiving contact is coupled with the second end of the semiconductor body. The injecting contact is coupled with the first end of the semiconductor body. Heat flow takes place between two side faces of the device, perpendicular to the first and second ends. The side face of the semiconductor body is configured to be positioned at or near a target object when electric current is applied to the injecting contact. The opposite side face of the semiconductor body is configured to be positioned at or near a heat sink object. The semiconductor body is configured to conduct the electric current along a conduction path extending from the injecting contact to the receiving contact. The side face of the semiconductor body is oriented to conduct heat from the target to the heat sink in a transverse direction with respect to the conduction path in response to the electric current being conducted along the conduction path.

In one embodiment, a method for manufacturing a transverse thermoelectric cooling device is provided. The method includes depositing alternating first and second layers of semiconductor materials to form a semiconductor body extending between opposite first and second ends and conductively coupling a receiving contact with the second end of the semiconductor body. The method also includes conductively coupling an injecting contact with the first end of the semiconductor body. A side face of the semiconductor body is thermally coupled with the semiconductor body at or near a receiving area of the semiconductor body that is configured to receive a target object and the semiconductor body is configured to conduct electric current through the obliquely oriented alternating first and second layers along a conduction path extending from the injecting contact to the receiving contact. The opposite side face of the semiconductor body is thermally coupled with the semiconductor body at or near a receiving area of the semiconductor body that is configured to receive a heat sink object. The side faces of the semiconductor body are configured to conduct heat from the target object to the heat sink object through the semiconductor body in a transverse directions with respect to the conduction path in response to the electric current being conducted along the conduction path.

In one embodiment, a transverse thermoelectric power generating device includes a semiconductor body, an electrically conductive negative contact, an electrically conductive positive contact, a thermally conductive side facet for heat absorption, and a thermally conductive side facet for heat rejection. The semiconductor body extends between opposite first and second ends and includes alternating first and second layers of semiconductor materials oriented at an oblique angle relative to the injected current flow. The negative contact is coupled with the second end of the semiconductor body. The positive contact is coupled with the first end of the semiconductor body. Heat flow takes place between two side faces of the device, perpendicular to the first and second ends. The side face of the semiconductor body is configured to be positioned at or near a warm object when electrical voltage and output current is measured at the positive contact. The semiconductor body is configured to conduct heat along a thermal path extending from the warm to the cold sides of the device. The side face of the semiconductor body is oriented to conduct heat from the warm source in a transverse direction with respect to the induced voltage and current between the positive and negative contacts.

In one embodiment, a method for manufacturing a transverse thermoelectric power generating device is provided. The method includes depositing alternating first and second layers of semiconductor materials to form a semiconductor body extending between opposite first and second ends and conductively coupling a positive contact with the negative contact at the second end of the semiconductor body. The method also includes conductively coupling a positive contact with the first end of the semiconductor body. A side face of the semiconductor body is coupled with the semiconductor body at or near a receiving area of the semiconductor body that is configured to receive a warm object. The opposite side face of the semiconductor body is coupled with the semiconductor body at or near a receiving area of the semiconductor body that is configured to receive a heat sink, and the semiconductor body is configured to conduct heat flow through the obliquely oriented alternating first and second layers along a thermal path extending from the warm side to the cold side. The side faces of the semiconductor body are configured to conduct heat from the warm object through the semiconductor body to the heat sink in a transverse direction with respect to the induced voltage and current in response to the heat flow being conducted along the thermal path.

In one embodiment, a transverse thermoelectric cooling device includes a semiconductor body, a conductive receiving contact, and a conductive injecting contact. The semiconductor body extends between opposite first and second ends and includes alternating first and second layers of semiconductor materials. The receiving contact is coupled with the second end of the semiconductor body. The injecting contact is coupled with the first end of the semiconductor body. Heat flow takes place radially outward, from the central to the outer region. The central region of the semiconductor body is surrounded by the contact at the second end, and is configured to be positioned at or near a target object when electric current is applied to the injecting contact. The outer region is configured to be positioned at or near a heat sink object to receive rejected heat. The semiconductor body is configured to conduct the electric current along a conduction path extending from the injecting contact to the receiving contact. The central region of the semiconductor body is configured to conduct heat from the target object to the heat sink through the alternating first and second layers of the semiconductor body in one or more transverse directions that are obliquely oriented with respect to the conduction path in response to the electric current being conducted along the conduction path.

In one embodiment, a method for manufacturing a transverse thermoelectric cooling device is provided. The method includes depositing alternating first and second layers of semiconductor materials to form a semiconductor body extending between opposite first and second ends and conductively coupling a receiving contact with the second end of the semiconductor body. The method also includes conductively coupling an injecting contact with the first end of the semiconductor body. The second end of the semiconductor body is coupled with the semiconductor body at or near a receiving area of the semiconductor body that is configured to receive a target object and the semiconductor body is configured to conduct electric current through the alternating first and second layers along a conduction path extending from the injecting contact to the receiving contact. The outer region of the semiconductor body is configured to receive a heat sink object. The central region of the semiconductor body is configured to conduct heat from the target object to the heat sink object through the semiconductor body in one or more partially transverse directions that are obliquely oriented with respect to the conduction path in response to the electric current being conducted along the conduction path.

In one embodiment, another transverse thermoelectric cooling device includes a semiconductor body, a conductive receiving contact, and a conductive injecting contact. The semiconductor body extends between opposite first and second ends and includes alternating first and second layers of semiconductor materials. The receiving contact is coupled with the second end of the semiconductor body and the injecting contact is coupled with the first end of the semiconductor body. The central region of the semiconductor body is configured to be positioned at or near a target object when electric current is applied to the injecting contact. The semiconductor body is configured to conduct the electric current through the alternating first and second layers along a conduction path extending from the injecting contact to the receiving contact. In response to the electric current being conducted by the semiconductor body from the injecting contact to the receiving contact, the semiconductor body conducts heat from the target object in one or more initial directions that are oblique to a conduction direction in which the electric current is conducted through the semiconductor body at a continuously varying oblique angle, such that at every point the heat flow is outwards from the central region.

In one embodiment, a transverse thermoelectric device includes a semiconductor body and first and second conductive contacts. The semiconductor body extends between opposite first and second ends along a first direction and between opposite first and second sides along a different, second direction. The semiconductor body includes alternating first and second layers of crystalline semiconductor materials. The first contact is coupled with the first end of the semiconductor body and the second contact is coupled with the second end of the semiconductor body. The first side of the semiconductor body is configured to be heated while the second side is cooler than the first side such that a temperature gradient is created through the semiconductor body between the first and second sides and along the second direction. The semiconductor body creates an electric voltage and electric current that is conducted along the first direction between the first and second contacts responsive to the heat flow induced by the temperature gradient being created in the semiconductor body.

In one embodiment, a transverse thermoelectric device includes a semiconductor body and first and second conductive contacts. The semiconductor body extends between opposite first and second ends along a first direction and between opposite first and second sides along a different, second direction. The semiconductor body includes alternating first and second layers of crystalline semiconductor materials. The first contact is coupled with the first end of the semiconductor body and the second contact is coupled with the second end of the semiconductor body. The semiconductor body is configured to conduct an electric current along a conduction path extending from the first contact to a second contact along a conduction direction, and the semiconductor body is configured to conduct heat along a different, transverse direction in response to the electric current being conducted such that the heat is conducted away from the second side toward the first side.

In one embodiment, a method for manufacturing a transverse thermoelectric transverse thermoelectric device is provided. The method includes depositing alternating first and second layers of semiconductor materials to form a semiconductor body extending between opposite first and second ends and conductively coupling a receiving contact with the second end of the semiconductor body. The method also includes conductively coupling an injecting contact with the first end of the semiconductor body. The second end of the semiconductor body is coupled with the semiconductor body at or near a receiving area of the semiconductor body that is configured to receive a target object. The outer portion of the semiconductor body is coupled with the semiconductor body at or near a receiving area of the semiconductor body that is configured to receive a heat sink object, and the semiconductor body is configured to conduct electric current through the alternating first and second layers along a conduction path extending from the injecting contact to the receiving contact. The first and second layers of the semiconductor body are configured to conduct heat from the target object to the heat sink object through the alternating first and second layers of the semiconductor body in one or more transverse directions that are obliquely oriented with respect to the conduction path in response to the electric current being conducted along the conduction path.

BRIEF DESCRIPTION OF THE DRAWINGS

The present inventive subject matter will be better understood from reading the following description of non-limiting embodiments, with reference to the attached drawings.

DETAILED DESCRIPTION

As used herein, an element or step recited in the singular and proceeded with the word "a" or "an" should be understood as not excluding plural of said elements or steps, unless such exclusion is explicitly stated. Furthermore, references to "one embodiment" of the presently described subject matter are not intended to be interpreted as excluding the existence of additional embodiments that also incorporate the recited features. Moreover, unless explicitly stated to the contrary, embodiments "comprising," "comprises," "including," "includes," "having," or "has" an element or a plurality of elements having a particular property may include additional such elements not having that property. Additionally, values of variables, coefficients, and the like are not intended to be limiting on all embodiments of the presently described inventive subject matter. In at least one embodiment, one or more different values may be used. The term "optimize" (and derivations thereof) is used herein, but does not require that a value or variable associated with the term "optimize" be maximized, minimized, or eliminated in all embodiments. For example, an "optimized" value may be a value that is increased or decreased (as appropriate) toward a designated goal value or other value, but that may not actually be the maximum or minimum value.

Figure 1:
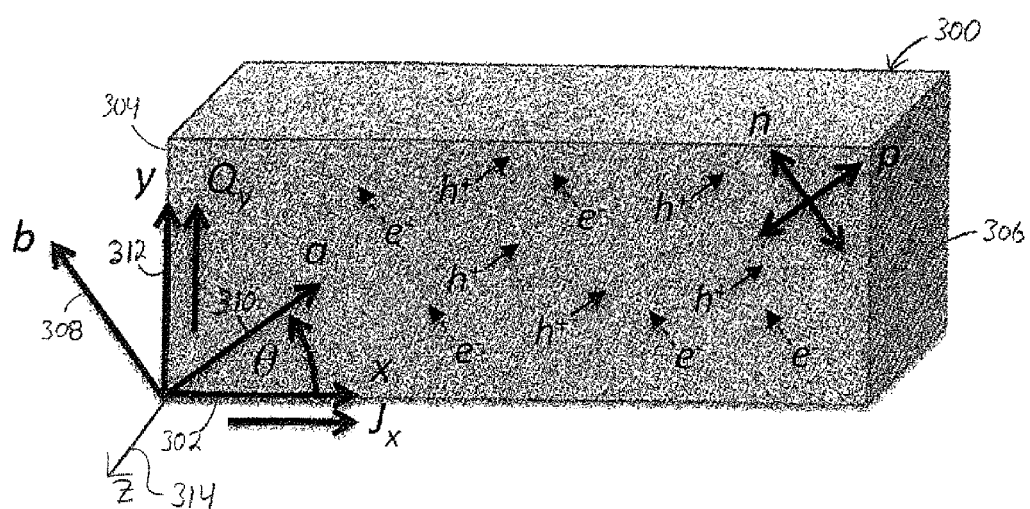
FIG. 1 illustrates a schematic diagram of one example of a semiconductor body exhibiting ambipolar transverse thermoelectric (ATT) properties.

FIG. 1 illustrates a schematic diagram of one example of a semiconductor body 300 exhibiting ambipolar transverse thermoelectric properties. In one embodiment, the semiconductor body 300 may represent the semiconductor body that is included in one or more of the transverse thermoelectric devices described and shown herein. The semiconductor body 300 may be formed from a stack of multiple crystalline semiconductor layers that are alternately stacked directly onto one another to form the body 300. These layers may be oriented parallel or substantially parallel to a plane extending in the a- and b-directions 310, 308 shown in FIG. 1.

In the semiconductor body 300, when an electric current is created and/or conducted through the body 300 along an x-direction 302 (e.g., from an contact joined to a first end 304 of the body 300 toward an contact joined to an opposite second end 306), electrons (e.g., "e−" in FIG. 1) in the semiconductor body 300 dominate conduction generally along directions that are parallel to a b-axis 308 and holes (e.g., "h+" in FIG. 1) in the semiconductor body 300 dominate conduction generally along direction that are parallel to an a-axis 310. As shown in FIG. 1, the a-axis 310 of hole conduction is oriented at an angle θ to the x-direction 302 and the b-axis 308 of electron conduction is oriented at the angle θ to a y-direction 312. The x- and y-directions 302, 312 are substantially perpendicular or perpendicular to each other, and the a-axis 310 and the b-axis 308 are substantially perpendicular or perpendicular to each other.

The electron and hole conductions in the body 300 result in a net charge current $J_x$ being conducted along the x-direction 302 through the body 300 and a net heat current $Q_y$ along the y-direction 312. The net heat current $Q_y$ represents the direction in which heat is conducted through the body 300. Controlling the angle θ based on one or more properties of layers in the semiconductor body 300 can allow for control of the directions in which heat is conducted by the semiconductor body 300 away from one or more target objects.

In order to control the angle θ, the semiconductor body 300 can be treated as having anisotropic electron and hole band conductivity tensors $\sigma_n$, $\sigma_p$, respectively, and isotropic electron and hole Seebeck tensors $s_n$, $s_p$, respectively. Axes a and b define reference axes of anisotropy in the semiconductor material. The conductivity tensors and Seebeck tensors may be defined as follows:

$$\sigma_n = \begin{bmatrix} \sigma_{n,aa} & 0 \\ 0 & \sigma_{n,bb} \end{bmatrix} \quad \text{(Equation \#1)}$$

$$\sigma_p = \begin{bmatrix} \sigma_{p,aa} & 0 \\ 0 & \sigma_{p,bb} \end{bmatrix} \quad \text{(Equation \#2)}$$

$$s_n = \begin{bmatrix} s_n & 0 \\ 0 & s_n \end{bmatrix} \quad \text{(Equation \#3)}$$

$$s_p = \begin{bmatrix} s_p & 0 \\ 0 & s_p \end{bmatrix} \quad \text{(Equation \#4)}$$

In one embodiment, the values of the Seebeck tensors $s_n$, $s_p$, are less than zero (e.g., negative) and greater than zero (e.g., positive), respectively. A total conductivity tensor Σ and a total resistivity tensor P for the semiconductor material may be defined as follows:

$$\Sigma = P^{-1} = \sigma_n + \sigma_p \quad \text{(Equation \#5)}$$

In the semiconductor body 300, a total Seebeck tensor S may be defined as follows:

$$S = (\sigma_p + \sigma_n)^{-1}(\sigma_p s_p + \sigma_n s_n) \quad \text{(Equation \#6)}$$

The single-band Seebeck tensors $s_n$ and $s_p$ (e.g., the Seebeck tensors for only electrons or holes) may be isotropic (e.g., within a single band alone thermoelectric heat conduction would occur parallel or antiparallel to electrical conduction), the conductivity tensors $\sigma_n$, $\sigma_p$ can be more strongly anisotropic (e.g., the electrical conduction in one direction is stronger than the perpendicular direction). A parameter ξ may be referred to as an ambipolar conductivity ratio for a designated direction within a group of the layers. The conductivity along the a-direction in the group of layers may be dominated by p-type conduction and can be defined as:

$$\xi_a = \frac{\sigma_{n,aa}}{\sigma_{p,aa}} < 1 \quad \text{(Equation \#7)}$$

The conductivity along the b-direction in the group of layers may be dominated by n-type conduction and can be defined as:

$$\xi_b = \frac{\sigma_{p,bb}}{\sigma_{n,bb}} < 1 \quad \text{(Equation \#8)}$$

The parameter ξ may be used to determine how much the n-type and p-type conductions in the superlattice will weight the Seebeck effect in one or more directions in the semiconductor body 300. A total Seebeck tensor of the layers may be defined as a matrix:

$$S = \begin{bmatrix} S_{p,aa} & 0 \\ 0 & S_{n,bb} \end{bmatrix} \quad \text{(Equation \#9)}$$

where the elements in the matrix that defines the total Seebeck tensor are positive when the ambipolar conductivity ratio for that direction is below a certain threshold, for example in the a direction:

$$\xi_a < \left|\frac{s_p}{s_n}\right| \quad \text{(Equation \#10 a)}$$

and negative when the ambipolar conductivity ratio for that direction is below a certain threshold, for example in the b direction:

$$\xi_b < \left|\frac{s_n}{s_p}\right| \quad \text{(Equation \#10 b)}$$

The elements in the matrix may be defined as:

$$S_{p,aa} = \frac{s_p + \xi_a s_n}{1 + \xi_a} > 0 \quad \text{(Equation #11 a)}$$

$$S_{n,bb} = \frac{s_n + \xi_b s_p}{1 + \xi_b} < 0 \quad \text{(Equation #11 b)}$$

These elements result in the diagonal Seebeck tensor of the form of Eq. #9 with respect to the planes defined by the layers in one embodiment. Such a diagonal Seebeck tensor can provide off-diagonal Seebeck terms in a θ-rotated (x, y) transport basis, with a current flow vector $J=J_x\hat{x}$ defining the x-axis. A Peltier tensor Π can be used to define a total Peltier heat flux density as $Q_{\Pi}=\Pi J=(TS)J$, where T represents the temperature. The longitudinal and transverse components of the total Peltier heat flux density in the semiconductor body 300 may be defined as:

$$Q_{\Pi,x} = Q_\Pi \cdot \hat{x} = (S_{p,aa}\cos^2\theta + S_{n,bb}\sin^2\theta)TJ_x \quad \text{(Equation #12)}$$

$$Q_{\Pi,y} = Q_\Pi \cdot \hat{y} = (S_{p,aa} - S_{n,bb})\cos\theta\sin\theta TJ_x \quad \text{(Equation #13)}$$

The total heat flux density $Q=Q_\Pi - \kappa^c \nabla T$ includes both Peltier and thermal conduction effects, where $\kappa_c$ as can define an open-circuit thermal conductivity tensor of the semiconductor body 300 at J=0. If the thermal gradient is orthogonal to the current density $$\nabla T = \frac{dT}{dy}\hat{y},$$

then the longitudinal electric field component $E_x$ may be constant or substantially constant throughout all or a substantial portion of the semiconductor body 300, and the heat flux component $Q_y$ may depend on y. The longitudinal current ($J_x$) and the transverse heat flow ($Q_y$) in the semiconductor body can be defined as follows:

$$J_x = \frac{1}{\rho_{xx}} E_x - \frac{S_{xy}}{\rho_{xx}} \frac{dT}{dy} \quad \text{(Equation #14)}$$

$$Q_y = T\frac{S_{yx}}{\rho_{xx}} E_x - (1+Z_{xy}T)\kappa_{yy}^c \frac{dT}{dy} \quad \text{(Equation #15)}$$

where $E_x$ represents the longitudinal electric field in the semiconductor body 300, $\rho_{xx}$ represents the longitudinal resistivity in the current flow direction, $\kappa_{yy}^c$ represents the open-circuit thermal conductivity tensor of the layers at J=0 in the heat flow direction.

The Seebeck tensor, S, of a material such as the semiconductor body 300 can be defined by the equation $E=S(\nabla T)$, where $\nabla T$ represents an applied temperature gradient in the semiconductor body 300 and E represents an electric field that is induced in the semiconductor body 300 by the temperature gradient. The temperature gradient can be applied to the semiconductor body 300 by exposing the semiconductor body 300 to a source of heat. If the vectors E and $\nabla T$ are non-parallel, then the Seebeck tensor is anisotropic. An anisotropic Seebeck tensor means that the Seebeck tensor has two different eigenvalues associated with two perpendicular directions. The Seebeck tensor is ambipolar if these two eigenvalues have opposite signs. A property of materials (e.g., the semiconductor body 300) with non-zero Seebeck tensors S is that an electric current density J in the materials also drives a heat flow density, Q, of the materials. This is expressed as Q=(ST)J, where T is the temperature in the material and the quantity ST defines the Peltier tensor of the material.

A complete Seebeck tensor $$S = \begin{bmatrix} S_{xx} & S_{xy} \\ S_{yx} & S_{yy} \end{bmatrix}$$

can be measured in a square sample of a material as follows. A primary axis x is defined parallel to one side of the sample. A temperature difference $\Delta T_x$ is applied to the sample by heating one end of the x-axis and/or cooling the opposite end of the sample. The Seebeck tensor component $S_{xx}$ represents the voltage $V_x$ along this x-axis that is induced in the sample by the applied temperature difference, divided by the temperature difference: $S_{xx}=V/\Delta T_x$. A secondary axis y is defined perpendicular to x and the Seebeck tensor component $S_{yx}$ represents the voltage $V_y$ along the y-axis that is induced in the sample by the same $\Delta T_x$, such that $S_{yx}=V_y/\Delta T_x$. A thermal difference $\Delta T_y$ is applied along the secondary axis of the sample and the induced voltage $V_y$ is measured to determine another Seebeck tensor component $S_{yy}=V_y/\Delta T_y$. Due to symmetry, the final remaining component of the Seebeck tensor may be defined as $S_{yx}=S_{yx}$.

The Seebeck tensor S can be shown or determined to be ambipolar in one or more ways. In one embodiment, ambipolarity of a material (such as the semiconductor body 300) is determined by measuring the complete Seebeck tensor as described above, and determining whether eigenvalues of the complete Seebeck tensor have opposite signs. If the eigenvalues have opposite signs, the Seebeck tensor is ambipolar. If the eigenvalues do not have opposite signs, then the Seebeck tensor may not be ambipolar.

Additionally or alternatively, ambipolarity of a material such as the semiconductor body 300 may be determined by applying a temperature difference $\Delta T_x$ to the material (e.g., by positioning the material near a source of heat) and measuring electric potential differences in the material. The electric potential differences represent the voltage that is induced in the material by the temperature gradient. The electric potential differences that are measured can be measured longitudinally $V_x$ (e.g., along the direction of the thermal gradient) and transversely $V_y$ (e.g., perpendicular or substantially perpendicular to the direction of the thermal difference). If any orientation can be found such that the transverse Seebeck tensor component $S_{yx}=V_y/\Delta T_x$ associated with the measured transverse voltage is greater in magnitude than the longitudinal Seebeck tensor component $S_{xx}=V_x/\Delta T_x$ associated with the measured longitudinal voltage, then the Seebeck tensor of the material is ambipolar.

Additionally or alternatively, a temperature difference $\Delta T_x$ can be applied to the material in a first direction and the voltage $V_x$ that is induced in the material by the temperature difference can be measured. Another temperature difference $\Delta T_y$ can be applied to the material in a second direction that is oriented perpendicular or substantially perpendicular to the first direction, and the voltage $V_y$ that is induced in the material by the temperature difference can be measured. If any orientation can be found such that the Seebeck coefficient $S_{xx}=V_x/\Delta T_x$ in the first direction has an opposite sign $S_{yy}=V_y/\Delta T_y$ as the Seebeck coefficient in the second direction, then the Seebeck tensor of the material is ambipolar.

In one or more of the embodiments described above that are used to measure the ambipolarity of a material, care is taken to not introduce (e.g., inject) electric current into or through the sample from an external source.

A transverse figure of merit may be defined as:

$$Z_{xy}T = \frac{S_{xy}S_{yx}T}{\rho_{xx}\kappa^c_{yy}} \quad \text{(Equation #16)}$$

This figure of merit may be defined for the semiconductor body having the layers, and can represent the flow of heat in a transverse direction through the layers when current is conducted through the layers in another direction. For layers having larger transverse figures of merit, larger amounts of heat are conducted in one or more transverse directions when electric current is conducted through the layers. Conversely, for layers having smaller transverse figures of merit, less heat is conducted in one or more transverse directions when the same electric current is conducted through the layers.

Under steady state conditions, $\nabla \cdot J = 0$ and $\nabla \cdot (Q + \bar{\mu}J) = 0$, where $\bar{\mu}$ represents the electrochemical potential and $-\nabla\bar{\mu} = E$ represents the electric field. Longitudinal Joule heating $E_x J_x$ equals to a divergence in the transverse heat flux density $Q_y$, which may be represented as:

$$\frac{dQ_y}{dy} = E_x J_x \quad \text{(Equation #17)}$$

Equations 14, 15, and 17 may be used to define the following differential equation:

$$0 = \frac{1}{S_{xy}S_{yx}}E_x^2 - \left[\frac{S_{xy}+S_{yx}}{S_{xy}S_{yx}} + \frac{d\ln\left(\frac{S_{yx}}{\rho_{xx}}\right)}{d\ln T}\frac{1}{S_{xy}}\right]E_x\frac{dT}{dy} + \left[1 + \frac{d\ln\left(\frac{S_{yx}S_{xy}}{\rho_{xx}}\right)}{d\ln T} + \frac{1}{Z_{xy}}\frac{d\ln\kappa^c_{yy}}{dT}\right]\left(\frac{dT}{dy}\right)^2 + \frac{1+Z_{xy}T}{Z_{xy}}\frac{d^2T}{dy^2}, \quad \text{(Equation #18)}$$

which with constant thermoelectric coefficients becomes $$0 = \left(\frac{E_x}{S_{xy}} - \frac{dT}{dy}\right)^2 + \frac{1+Z_{xy}T}{Z_{xy}}\frac{d^2T}{dy^2} \quad \text{(Equation #19)}$$

In one embodiment, the conduction angle $\theta$ at which electric current is conducted through the layers of the semiconductor body 300 can be controlled in order to increase the transverse figure of merit for the layers in the body 300. For example, for the same semiconductor body formed from the same layers using different conduction angles $\theta$ at which electric current is conducted between the contacts can change the transverse figure of merit. As one example, the conduction angle $\theta$ at which the transverse figure of merit is larger than one or more other conduction angles $\theta$ may be determined from the following relationship:

$$\cos^2\theta_\perp = \frac{1}{1 + \sqrt{\frac{\kappa_{bb}/\kappa_{aa}}{\rho_{bb}/\rho_{aa}}}} \quad \text{(Equation #20)}$$

where $\theta_\perp$ represents the conduction angle $\theta$ associated with one or more larger (or the largest) transverse figures of merits, $\kappa_{bb}$ and $\kappa_{aa}$ represent thermal conductivity tensor components of the semiconductor body 300 along the b-direction (e.g., in directions that are transverse to the conduction of current) and a-direction (e.g., in directions that are parallel to the conduction of current), respectively, and $\rho_{aa}$ and $\rho_{bb}$ represent the resistivity tensor components of the body 300 along the a- and b-directions, respectively. The transverse figure of merit that is obtained by conduction of electric current along the conduction angle $\theta_\perp$ may be defined as:

$$Z_\perp T = Z_{xy}(\theta_\perp)T = \frac{(s_{p,aa} - s_{n,bb})^2 T}{\left(\sqrt{\rho_{aa}\kappa_{aa}} + \sqrt{\rho_{bb}\kappa_{bb}}\right)^2} \quad \text{(Equation #21)}$$

In order to identify materials to be used to form the layers, the band structures of the materials may be examined. In one embodiment, the layers in the semiconductor body 300 include two different layers (e.g., first and second layers alternately stacked onto each other). The first layers may be formed from a material having a relatively high valence band energy and the second layers may be formed from a material having a relatively low conduction band energy. A power factor ($PF_\perp$) may be defined as a parameter that indicates the efficiency in which the layers transversely conduct heat when a current is applied through the layers. Additionally or alternatively, the power factor may indicate the efficiency at which the layers generate electric current when exposed to a temperature gradient. This power factor ($PF_\perp$) can be based on the valence and conduction bands of the materials used to form the layers. In one embodiment, the power factor ($PF_\perp$) can be defined as follows:

$$PF_\perp = \frac{(s_{p,aa} - s_{n,bb})^2}{\left(\sqrt{\rho_{aa}} + \sqrt{\rho_{bb}}\right)^2} \quad \text{(Equation #22)}$$

The power factor ($PF_\perp$) can be calculated for a variety of combinations of materials, and those combinations of materials exhibiting larger power factors ($PF_\perp$) than one or more other combinations of materials may be selected for use to form the superlattice.

In one embodiment, the layers may be formed from InAs and GaSb. For example, the semiconductor body 300 may represent an InAs/GaSb Type II broken gap superlattice (T2SL). These materials can exhibit a broken energy band gap alignment at the heterointerface between the layers. For example, the edge of the valence band of GaSb may be greater than (e.g., above) the edge of the conduction band of InAs. The thicknesses of the layers formed by InAs and GaSb may have varying (e.g., different) widths in the semiconductor body 300, which may cause the quantum confinement energy to be controlled (e.g., change in response to varying thicknesses of the layers) to produce a spatially indirect semiconductor energy gap. The thicknesses of the layers may be varied in order to tune (e.g., control) the quantum confinement energy, such as through a value of zero to a positive gap. The relatively heavy hole mass in the layers formed from GaSb can assist in preventing the holes from tunneling through the layers formed from InAs. As a result, the conductivity of holes in the semiconductor body 300 may be largely anisotropic (e.g., predominantly in one direction, such as parallel to the planes defined by the layers), since the current of the holes generally flows parallel to the layers and the InAs layers act as barriers to the holes.

A three dimensional ellipsoidal effective mass approximation may be used for the conductivity of electrons and a two dimensional circular effective mass approximation may be used for the conductivity of holes in the semiconductor body 300 formed from InAs and GaSb to determine the following conductivity and Seebeck tensor components:

$$\sigma_{n,aa} = \frac{2\sqrt{2}\, e^2 \gamma}{3\pi^2 \hbar^3} \sqrt{m_{n,b}}\, (k_B T)^{s+\frac{3}{2}} \Gamma\!\left(s+\frac{5}{2}\right) F_{s+\frac{3}{2}}\!\left(\frac{\mu - E_g}{k_B T}\right) \quad \text{(Equation \#23)}$$

$$\sigma_{n,bb} = \frac{2\sqrt{2}\, e^2 \gamma}{3\pi^2 \hbar^3} \sqrt{\frac{m_{n,a}^2}{m_{n,b}}}\, (k_B T)^{s+\frac{3}{2}} \Gamma\!\left(s+\frac{5}{2}\right) F_{s+\frac{3}{2}}\!\left(\frac{\mu - E_g}{k_B T}\right) \quad \text{(Equation \#24)}$$

$$\sigma_{p,aa} = \frac{e^2 \gamma}{\pi d \hbar^2} (k_B T)^{s+1} \Gamma(s+2) F_{s+1}\!\left(\frac{-\mu}{k_B T}\right) \quad \text{(Equation \#25)}$$

$$\sigma_{p,bb} = 0 \quad \text{(Equation \#26)}$$

$$s_n = -\frac{k_B}{e} \left[ \frac{\left(s+\frac{5}{2}\right) F_{s+\frac{3}{2}}\!\left(\frac{\mu - E_g}{k_B T}\right)}{\left(s+\frac{3}{2}\right) F_{s+1/2}\!\left(\frac{\mu - E_g}{k_B T}\right)} - \frac{\mu - E_g}{k_B T} \right] \quad \text{(Equation \#27)}$$

$$s_p = \frac{k_B}{e} \left[ \frac{(s+2) F_{s+1}\!\left(\frac{-\mu}{k_B T}\right)}{(s+1) F_s\!\left(\frac{-\mu}{k_B T}\right)} + \frac{\mu}{k_B T} \right] \quad \text{(Equation \#28)}$$

where $m_i$ represents the effective mass component of the band of interest n or p in the direction of a or b, $\mu$ is the electrochemical potential measured relative to the valence band-edge, and F is the Fermi-Dirac integral $$F_r(\xi) = \int_0^\infty \xi^r \frac{1}{1+e^\xi}.$$

$\gamma$ is the coefficient of the scattering time, and the scattering exponent s is defined $\tau = \gamma E^s$ where E is the kinetic energy of the carrier measured relative to the band edge of interest and $\tau$ is the scattering time constant. The room temperature carrier scattering may be dominated by interface roughness scattering, so the carrier mobility may be independent of temperature and s=0. Then $\gamma$ can be calculated from equation $\gamma = \mu_c m^*/e$, $\mu_c$ is the carrier mobility, m* is the carrier effective mass and e is the electron charge. The band structure of the semiconductor body 300 can be calculated with the 8×8 k·p envelope function method, or using another method.

In one embodiment, the power factor ($PF_\perp$) can be calculated for different combinations of the thicknesses of the layers. With respect to the example where InAs and GaSb are used as the layers, an increased or maximum power factor ($PF_\perp$) may be found at or near a temperature of 300 K with layer thicknesses $d_{InAs}$=7.88 nanometers (nm) and $d_{GaSb}$=3.96 nm in one embodiment. Alternatively, a different power factor may be found using another temperature and/or another layer thickness of one or more of the InAs and/or GaSb layers.

The power factor ($PF_\perp$) may additionally or alternatively be calculated for various combinations of thicknesses as measured in atomic monolayers within each material layer. For example, different combinations of monolayers for the layers per period may be used, and the different power factor ($PF_\perp$) calculated for the various combinations. The combination or combinations of monolayers associated with a larger or the largest power factor ($PF_\perp$) may be used to create the semiconductor body 300. In one embodiment, 27 monolayers of InAs and 10 monolayers of GaSb per period are used. Alternatively, another number and/or combination of monolayers may be used.

With respect to an embodiment of the semiconductor layer 300 having InAs and GaSb, the electron and hole effective masses may be determined at the band edge to be $m_{n,a}$=0.028$m_0$, $m_{a,b}$=0.025$m_0$ and $m_{p,a}$=0.047$m_0$, where $m_0$ represents the free space electron mass. Alternatively, these masses may have other values. The energy gap can be calculated to be $E_g$=34.2 millielectronVolts (meV). Alternatively, the energy gap and/or chemical potential may have another value. The conduction angle $\theta_\perp$ that provides a larger or maximum power factor ($PF_\perp$) relative to other angles may be anywhere between 1 and 89 degrees. For example, the conduction angle $\theta_\perp$ may be 37±1 degrees in one embodiment. Alternatively, the conduction angle $\theta_\perp$ may be 32±1 degrees. Alternatively, another conduction angle $\theta_\perp$ may be used. The out-of-plane thermal conductivity was measured to be 4 Watts per meter Kelvin in one embodiment. Alternatively, the out-of-plane component of the thermal conductivity may be another value, such as 3 to 5 Watts per meter Kelvin, 2 to 6 Watts per meter Kelvin, or another value. In one embodiment, the power factor ($PF_\perp$) is determined for such a semiconductor body 300 and a conduction angle of 37 degrees to be approximately 0.030 at room temperature (e.g., 70 degrees Fahrenheit or 21 degrees Celsius). In another embodiment, the power factor is determined to be approximately 0.025 at room temperature for a conduction angle of 32 degrees. Alternatively, other power factors may be determined.

Figure 2:
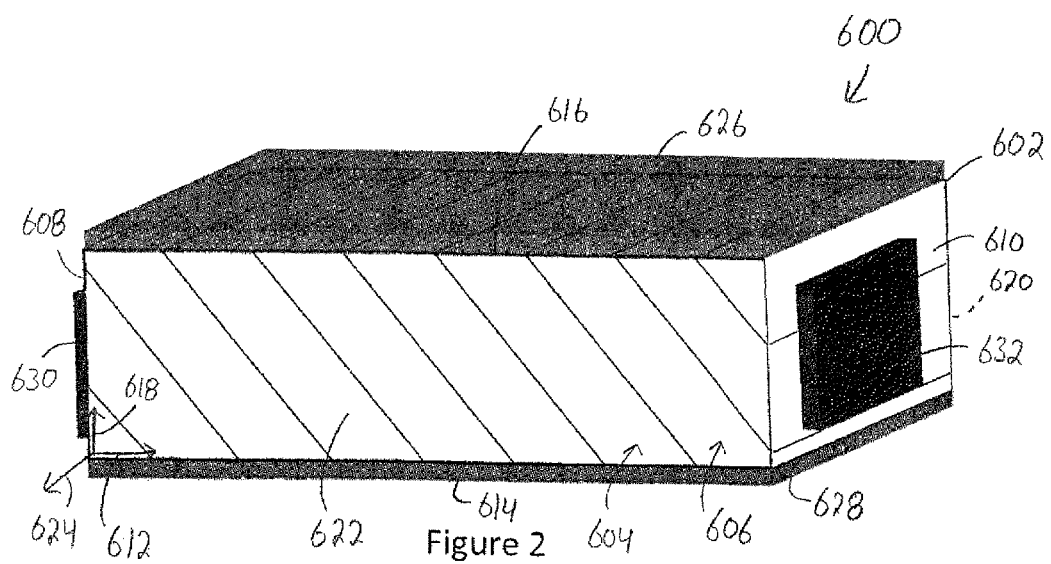
FIG. 2 is a schematic diagram of one embodiment of a rectangular-shaped transverse thermoelectric device.

FIG. 2 is a schematic diagram of one embodiment of a rectangular-shaped transverse thermoelectric device 600. The device 600 may include a semiconductor body 602 formed from ATT material with anisotropic thermoelectric property. For example, the semiconductor body 602 may represent or include the semiconductor body 300 shown and described in connection with FIG. 1. The semiconductor body 602 extends between opposite ends 608, 610 in a first direction 612, between opposite sides 614, 616 in a second orthogonal direction 618, and between opposite sides 620, 622 in a third orthogonal direction 624.

The semiconductor body 602 is formed from crystalline semiconductor layers 604, 606 that are stacked together to form a superlattice (SL). As shown in the illustrated embodiment, the semiconductor layers 604, 606 and/or interfaces between the layers 604, 606 are obliquely oriented with respect to the directions 612 and 618, and lie in the same plane as the direction 624. The longitudinal Seebeck tensor component is n-type in directions that are perpendicular to the layers 604, 606, and p-type in directions that are parallel to the layers 604, 606. Conductive contacts 630, 632 are conductively coupled with the ends 608, 610. Thermally conductive but electrically insulating slabs 626, 628 are connected with the opposite sides 614, 616 in the illustrated embodiment.

If a temperature difference is applied to the thermally conductive slabs 626, 628, the semiconductor body 300 can generate an electrical voltage difference between the contacts 630, 632, and induce a corresponding electrical current flow between these contacts. For example, if the slab 626 has a higher temperature than the opposite slab 628 (and a temperature gradient along or opposite to the direction 618 exists), the ATT material of the semiconductor body 300 will generate an electrical voltage difference in a direction that is perpendicular to the temperature gradient (e.g., along or opposite to the direction 612). This voltage difference can result the contact 632 having a higher voltage potential than the opposite contact 630. This voltage difference can be used to extract power from the device 600, such as by conductively coupling an electric energy storage device (e.g., a battery) and/or one or more loads with the contacts 630, 632. The device 300 can then operate as a thermoelectric generator of electric power.

In one embodiment, the device 600 can operate as a cooling device. If an electrical current is injected into the body 602 through the contact 630 and is conducted along the direction 612 to the contact 632, this laterally conducted electrical current can induce a heat flow in the body 602. Such a heat flow can flow from the side 616 to the opposite side 614 in the body 602 and generally in a direction that is opposite of the direction 618. As a result, the slab 626 can be cooled and the opposite slab 628 may be used as a heat sink to remove the heat from the body 602.

Figure 3:
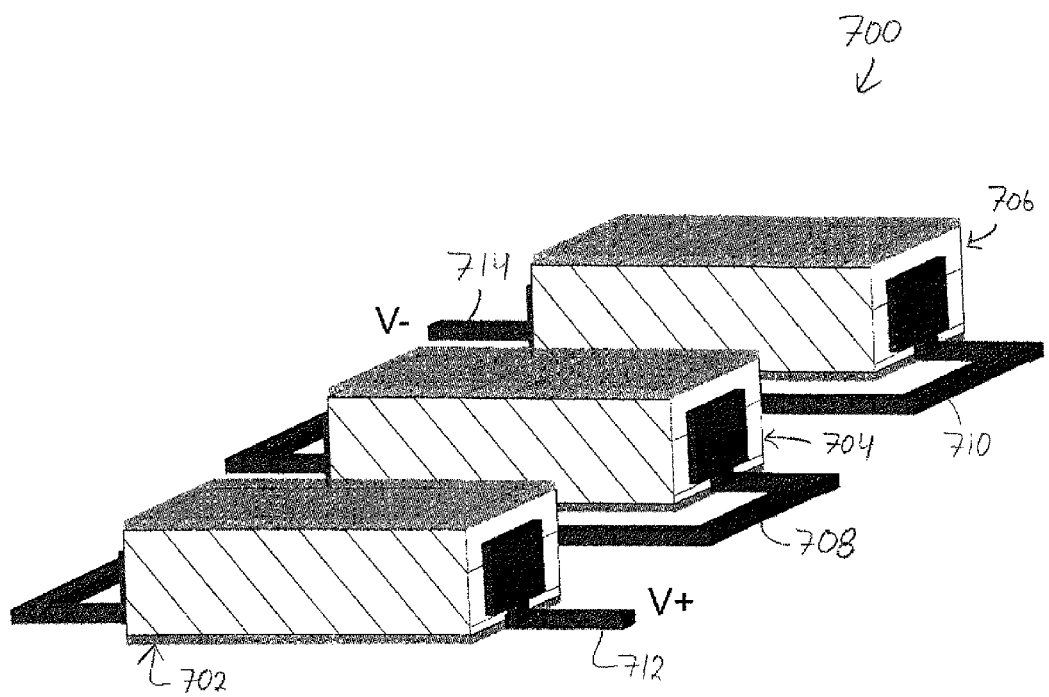
FIG. 3 is a schematic diagram of one embodiment of a meander-line-shaped transverse thermoelectric device for inducing larger voltages.

FIG. 3 is a schematic diagram of one embodiment of a meander-line-shaped transverse thermoelectric device 700 for inducing larger voltages. The device 700 may alternatively be referred to as a transverse thermoelectric system. The device 700 includes several transverse thermoelectric devices 702, 704, 706 conductively coupled in series with each other. One or more, or all, of the devices 702, 704, 706 can represent the device 600 shown in FIG. 2. For example, the device 700 can include several transverse thermoelectric devices 600 conductively coupled end-to-end with each other in a meander structure. Although the device 700 is shown as including three devices 702, 704, 706, alternatively, the device 700 can include two devices 702, 704, 706 or more than three devices 702, 704, 706.

The devices 702, 704, 706 are conductively coupled with each other in a series by conductors 708, 710, such as bus bars, wires, contacts, and the like. For example, a first conductor 708 may conductively couple the contact 632 of a first device 600 (e.g., the device 702) with the contact 630 of a second device 600 (e.g., the device 704) and a second conductor 710 may conductively couple the contact 632 of the second device 600 with the contact 630 of a third device 600 (e.g., the device 704). This meander shape device 700 can generate larger voltages than a single device 600 alone in one embodiment. For example, by extending this thermoelectric system to an arbitrarily large number of elements, an arbitrarily large voltage difference may be achieved at two end contacts 712, 714 of the device 700 from a small temperature difference between the top and bottom slabs.

Figure 4:
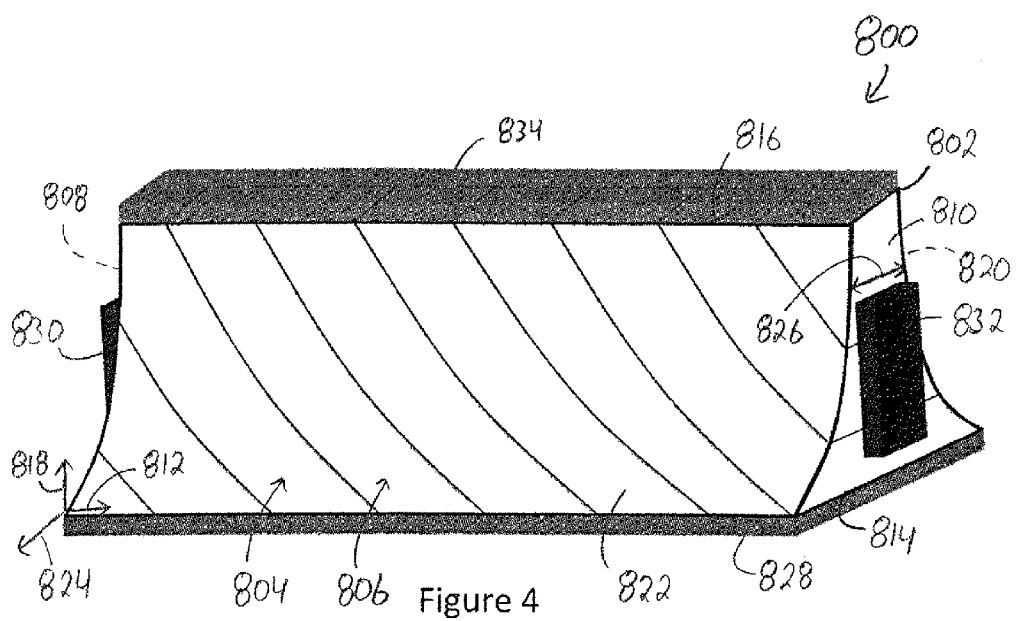
FIG. 4 is a schematic diagram of one embodiment of an exponentially tapered transverse thermoelectric device for inducing large temperature differences.

FIG. 4 is a schematic diagram of one embodiment of an exponentially tapered transverse thermoelectric device 800 for inducing relatively large temperature differences. The device 800 includes a semiconductor body 802 formed from ATT material with anisotropic thermoelectric property. For example, the semiconductor body 802 may represent or include the semiconductor body 300 shown and described in connection with FIG. 1. The semiconductor body 802 extends between opposite ends 808, 810 in a first direction 812, between opposite sides 814, 816 in a second orthogonal direction 818, and between opposite sloping sides 820, 822 in a third orthogonal direction 824.

The semiconductor body 802 has a tapered shape in the illustrated embodiment. A width dimension 826 of the body 802 may be measured as the distance between the sloping sides 820, 822 in a direction that is parallel to the direction 824. The semiconductor body 802 may have a larger width dimension 826 at or near the end 814 and smaller width dimensions at other locations in the body 802 that are closer to the opposite end 816.

The sloping sides 820, 822 of the tapered body 802 are disposed at oblique angles with respect to the end 814 and/or the end 816. For example, the sloping sides 820, 822 may be obliquely angled with respect to a plane defined by the directions 812, 814 and/or with respect to a plane defined by the directions 812, 818. In the illustrated embodiment, the sides 820, 822 have smooth surfaces in the shapes of exponential curves. Alternatively, the sloping sides 820, 822 may have smooth surfaces in other shapes, such as a planar shape or the shape of another mathematical function. In another embodiment, the sloping sides 820, 822 may have surfaces that are not smooth, such as jagged, sawtooth, or stair step-shaped surfaces.

The semiconductor body 802 is formed from crystalline semiconductor layers 804, 806 that are stacked together to form a superlattice (SL). As shown in the illustrated embodiment, the semiconductor layers 804, 806 and/or interfaces between the layers 804, 806 are obliquely oriented with respect to the directions 812 and 818, and parallel to the direction 824. The longitudinal Seebeck tensor component is n-type in directions that are perpendicular to the layers 804, 806, and p-type in directions that are parallel to the layers 804, 806. Conductive contacts 830, 832 are conductively coupled with the ends 808, 810. Thermally conductive but electrically insulating slabs 828, 834 are connected with the opposite sides 814, 816 in the illustrated embodiment.

In one embodiment, the device 800 can operate as a cooling device. If an electrical current is injected into the body 802 through the contact 830 and is conducted along the direction 812 to the contact 832, this laterally conducted electrical current can induce a heat flow in the body 802. Such a heat flow can flow from the side 816 to the opposite side 814 in the body 802 and generally in a direction that is opposite of the direction 818. As a result, the slab 834 can be cooled and the opposite slab 828 may be used as a heat sink to remove the heat from the body 802.

The wider portions of the semiconductor body 802 that are disposed closer to the end 814 than the end 816 can conduct the heat from the narrower portions of the semiconductor body 802 that are disposed closer to the end 816 than the wider portions of the body 802. These wider portions also can remove (e.g., conduct) the ohmic heat generated within the body 802. With electrical current applied to the contacts 830, 832, the tapered device 800 can cool the slab 834 to relatively low temperatures.

In one embodiment, an exponentially tapered device 800 can function similar to stacking several layers of rectangular ATT devices (e.g., the device 600 shown in FIG. 3) with smaller rectangular devices above (e.g., along the direction 818) larger rectangular devices. The lower devices can not only remove the heat from the devices disposed above, but the lower device also can remove the ohmic heat generated within the lower device. With electrical current applied to the contacts 830, 832 and a fixed heat sink temperature at the bottom of the device 800, this exponentially tapered ATT cooler can cool the slab 834 to arbitrarily low temperatures with sufficiently thick material in the semiconductor body 802.

Figure 5:
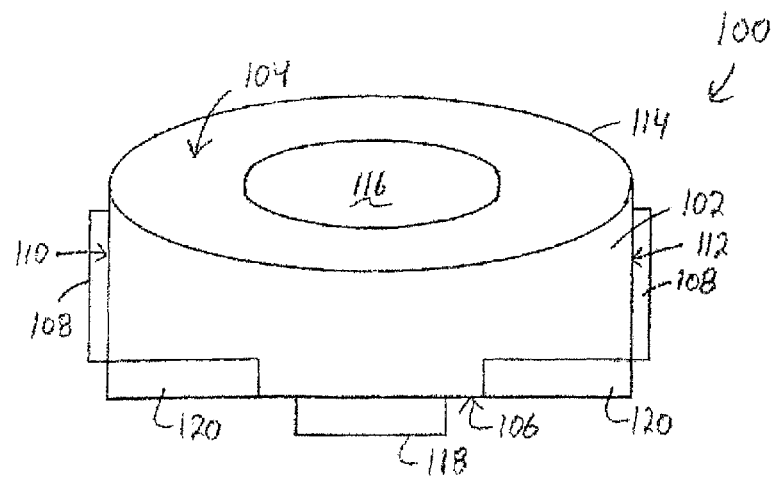
FIG. 5 is a schematic diagram of one embodiment of an annular-shaped transverse thermoelectric device.
Figure 6:
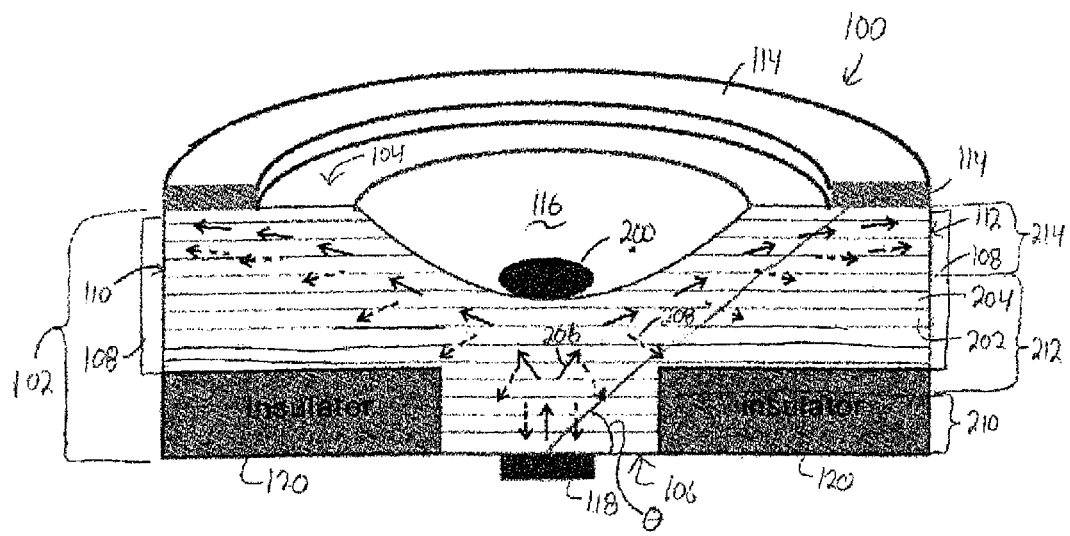
FIG. 6 is one embodiment of a cross-sectional view of the transverse thermoelectric device shown in FIG. 5.

FIG. 5 is a schematic diagram of one embodiment of a transverse thermoelectric device 100. FIG. 6 is one embodiment of a cross-sectional view of the transverse thermoelectric device 100 shown in FIG. 5. As described herein, the transverse thermoelectric device 100 conducts electric current and thermal energy (e.g., heat) in transverse and oblique directions within the device 100. The device 100 may be used as a cooling device and/or as a current-generating device. For example, the device 100 may be placed in contact with or in close proximity to a target object to be cooled by the device 100. Electric current is conducted through the device 100, which causes heat from the target object to be conducted in transverse or oblique directions (relative to the conduction path of the electric current) away from the target object to cool the target object. As another example, the device 100 may be heated or otherwise receive thermal energy such that a temperature gradient exists across the device 100. The temperature gradient can cause electric current to be generated and be conducted within the device 100 in one or more direction that are transverse or oblique to the direction of the temperature gradient. This current can be extracted from the device 100 for storage and/or to power (or assist in powering) one or more loads. The transverse thermoelectric device 100 includes a semiconductor body 102 that extends between a first end 104 and an opposite, second end 106. The semiconductor body 102 may represent or include the semiconductor body 300 shown in FIG. 1. In one embodiment, the central region near first end 116 may be referred to as an interface end because 116 can engage or be placed in close proximity to an object being cooled by the transverse thermoelectric device 100 (referred to herein as a target object). For example, the interface end 116 can engage one or more locations of a computer processor or other computing device in order to draw thermal energy (e.g., heat) out of the processor or computing device to one or more heat sinks 108. The heat sinks 108 are thermally conductive bodies, such as metal or metal alloy bodies or foils, that are connected with sides 110, 112 of the body 102 that extend between the first and second ends 104, 106. The heat sinks 108 receive the thermal energy that is drawn from the target object by the body 102. The heat sinks 108 may be coupled with one or more other thermally conductive bodies to transfer the heat from the target object to another location. Alternatively, the heat sinks 108 may not be provided. In another embodiment, the device 100 may receive thermal energy (e.g., heat) at one or more of the sides 110, 112, such that a thermal energy gradient is created across the body 102. For example, a larger amount of thermal energy may be present in the body 102 at or near the sides 110 and 112 than at the center of the body 102 at the region labeled 116. This thermal gradient can cause electric current to be generated within the body 102.

The first end 104 includes a first contact 114. In an embodiment where the device 100 is used as a cooling device, the contact 114 may be referred to as a receiving contact. Such a receiving contact can receive current that is conducted through the body 102. In the illustrated embodiment, the first contact 114 is an annular conductive body that extends around and defines a target area 116 of the device 100. Alternatively, the contact 114 may not extend around the entire perimeter of the receiving area 116 and/or may have another non-annular shape. In one embodiment, the target area 116 represents a location where the target object to be cooled (or at least a portion thereof) is located when the transverse thermoelectric device 100 operates to cool the target object. For example, the transverse thermoelectric device 100 may be positioned within an infrared (IR) camera such that one or more pixels of the camera are located within the receiving area 116. The transverse thermoelectric device 100 may then operate to cool (e.g., remove thermal energy from) the pixel located in the receiving area 116. In one embodiment, the receiving area 116 represents a volume extending into the transverse thermoelectric device 100 in which the target object (or a portion thereof) is disposed.

A second contact 118 is connected with the second end 106 of the body 102. In an embodiment where the device 100 is used as a cooling device, the second contact may be referred to as an injecting contact. For example, the contact 118 may be used to inject an electric current into the body 102 to cool the target object. The second contact 118 is a conductive body that can receive electric current from a power source (e.g., to cool the target object) and/or that can be coupled with another conductive body to convey electric current generated in the body 102 (e.g., when the device 100 is used to generate electric current). In an embodiment where the second contact 118 injects electric current from a power source, the current is conducted through the body 102 to the receiving contact 114. As described below, the conduction of the current from the injecting contact 118 to the receiving contact 114 causes thermal energy (e.g., heat) to be conducted from the target object (e.g., in the receiving area 116) to the heat sinks 108 through the body 102. Therefore, electric current is conducted through the body 102 in direction that is generally oriented from the injecting contact 118 to the receiving contact 114 while heat is conducted through the body 102 in a generally transverse direction (e.g., from the receiving area 116 to the sides 110, 112 of the body 102). Alternatively, the second contact 118 may be used to extract current and electrical power from the device 100. For example, if a temperature gradient is applied across the device 100 (e.g., from the center 116 to the sides 110, 112), then the contacts 114, 118 may be connected to an energy storage device (e.g., a battery) and/or a load for the storage device and/or load to receive current generated in the body 102 from the gradient.

The body 102 includes one or more dielectric bodies 120 (also referred to as "insulators") disposed at or near the second end 106 of the body 102. The dielectric bodies 120 can represent a single, continuous annular (or other shape) body. Alternatively, the dielectric bodies 120 can represent two or more separate bodies. As described below, the dielectric bodies 120 assist in providing a shape of the body 102 that improves transverse thermoelectric conduction through the body 120. For example, the position of the dielectric bodies 120 shown in FIGS. 5 and 6 can establish a conduction angle $\theta$ at which electric current is conducted through the semiconductor body 102. The conduction angle $\theta$ can be measured as or represent the angle of a conduction path between the contacts 114, 118 from the planes defined by one or more of the layers 202, 204, as shown in FIG. 6. The conduction of thermal energy to the heat sinks 108 on the sides 110, 112 of the body 102 can be improved by controlling the conduction angle $\theta$ between the contacts 114, 118, as described below. Additionally or alternatively, the generation of electric current can be increased by controlling the conduction angle $\theta$ between the contacts 114, 118.

The body 102 may be formed from several relatively thin layers 202, 204. For example, the body 102 may be formed from a superlattice structure having alternating layers 202, 204 of semiconductor materials. Examples of different types and combinations of materials to be used for the layers 202, 204 are described below. The body 102 may include several sets (e.g., pairs) of the alternating layers 202, 204. The layers 202, 204 may be crystalline semiconductor materials.

In one embodiment, the layers 202, 204 are formed from different Type II superlattice materials, such as semiconductor materials having Type II band alignment. In another embodiment, the layers 202, 204 may be formed from other materials with different band alignment, such as Type I, or from a single material with anisotropic crystal structure. For example, the layers 202, 204 may be formed from Type I superlattice or anisotropic materials having different electrical conductivities in different directions within each layer 202, 204. In the illustrated embodiment, except for the outermost layers 202, 204 disposed at each of the ends 104, 106, the other interior layers 202, 204 may each directly abut a pair of the other layer 202, 204. For example, each interior layer 202 may be sandwiched between and directly engage or contact a layer 204 below the layer 202 and another layer 204 above the layer 202. Similarly, each interior layer 204 may be sandwiched between and directly engage or contact a layer 202 below the layer 204 and another layer 202 above the layer 204.

In one embodiment, a target object 200 (or at least a portion thereof) may be disposed within the target area 116 of the body 102 of the transverse thermoelectric device 100 or may engage (or be disposed relatively close to) the body 102 within the area 116 in order for the target object 200 to be cooled by the device 100. As described below, the properties of the layers 202, 204 cause the body 102 to conduct thermal energy (e.g., heat) in directions that are dependent on which direction that the electric current is conducting through the body 102. Several solid arrows 206 represent the direction of conduction of electric current through the body 102 generally from the injecting contact 118 to the receiving contact 114. Several dashed arrows 208 represent the direction of conduction of thermal energy (e.g., heat) through the body 102 when the current is conducted through the body 102.

In another embodiment, the properties of the layers 202, 204 cause the body 102 to generate electric current in directions that are dependent on directions in which a temperature gradient is created in the body 102. For example, if the dashed arrows 208 represent the direction of a temperature gradient in the body 102, then the solid arrows 206 can represent the direction in which electric current is generated and conducted through the body 102.

The solid arrows 206 show that the electric current is conducted in a generally perpendicular direction to the planes defined by the layers 202, 204 in a first end section 210 of the body 102. The properties of the layers 202, 204 (e.g., the band gaps and/or thicknesses, as described below) in this end section 210 of the body 102 cause the thermal energy (e.g., heat) to flow in an opposite direction in the first end section 210, as shown by the solid arrows 206, 208 being oriented in opposite directions.

In an interior section 212 of the body 102, the electric current is conducted in directions (e.g., solid arrows 206) that are generally obliquely oriented with respect to the planes defined by the layers 202, 204 and/or the interfaces between the layers 202, 204. For example, the electric current may be conducted through the layers 202, 204 in the interior section 212 in directions that are neither perpendicular nor parallel to the layers 202, 204 or the interfaces between the layers 202, 204. The properties of the layers 202, 204 thermally conduct the heat from the target object 200 in the interior section 212 in directions that are transverse (e.g., perpendicular or non-parallel) to the direction in which the electric current is conducted, when the electric current is conducted along oblique directions relative to the layers 202, 204. As a result, and as shown by the dashed arrows 208 in the interior section 212 of the body 102, the thermal energy (e.g., heat) is conducted in directions toward the sides 110, 112 of the body 102.

In a second end section 214 of the body 102 that is opposite of the first end section 210, the electric current is conducted in directions (e.g., solid arrows 206) that are generally parallel to the planes defined by the layers 202, 204 and/or the interfaces between the layers 202, 204. For example, the electric current may be conducted through the layers 202, 204 in the interior section 212 in directions that are relatively close to being parallel to the layers 202, 204 or the interfaces between the layers 202, 204 (e.g., within 10 degrees or less of being parallel, within 8 degrees or less of being parallel, within 5 degrees or less of being parallel, within 3 degrees or less of being parallel, or closer to being parallel). The properties of the layers 202, 204 thermally conduct the heat from the target object 200 in the interior section 212 in directions that also are relatively close to being parallel to the layers 202, 204 and/or the interfaces between the layers 202, 204. As a result, and as shown by the dashed arrows 208 in the second end section 214 of the body 102, the thermal energy (e.g., heat) is conducted in directions toward the sides 110, 112 of the body 102.

The transverse thermoelectric device 100 may be used to cool the target object 200 by applying the electric current to the injecting contact 118. As described above, the different directions in which the electric current is conducted through the body 102 relative to the orientations of the layers 202, 204 causes thermal energy (e.g., heat) from the target object 200 to be conducted in different directions. For example, the directions in which the heat is conducted are dependent upon the directions in which the current is locally conducted in the body 102. The result is that the heat is conducted away from the target object 200 and toward the sides 110, 112 and the heat sinks 108, and/or toward the end 106 of the body 102.

The transverse thermoelectric device 100 may be able to cool the target object 200 at relatively low temperatures. For example, the transverse thermoelectric device 100 may cool the target object 200 at cryogenic temperatures (e.g., temperatures of −150 degrees Celsius and below) without freezing the carriers in the layers 202, 204 of the transverse thermoelectric device 100. The layers 202, 204 can be composed of narrow gap semiconductors which may continue to thermally generate charge carriers and/or otherwise produce charge carriers at such temperatures when electric current is conducted through the layers 202, 204.

In the illustrated embodiment, the relative sizes of the layers 202, 204 in different sections of the semiconductor body 102 assist in conducting the heat away from the target object 200. The dielectric bodies 120 are positioned so that the body 102 has larger (e.g., wider in the view of FIG. 6) layers 202, 204 at or near the interface between the body 102 and the target object 200 and smaller (e.g., narrower in the view of FIG. 6) layers 202, 204 at or near the end 106 of the body 102. Changing the size of the layers 202, 204 throughout the thickness of the body 102 (e.g., as measured between the ends 104, 106) can assist in the conduction of the heat. For example, the radius of the layers that are disposed at or near the target object 200 can receive smaller amounts of thermal energy relative to the radius of the layers 202, 204 that are farther from the target object 200 and closer to the heat sinks 108. As a result, these layers at large radius 202, 204 can accept more thermal energy from the target object 200. The layers at large radius that are farther from the target object 200 can receive larger amounts of heat, but can dissipate the heat faster (e.g., to the surrounding atmosphere and/or a heat sink) from the body 102 than the layers 202, 204 at small radius from target object 200.

The conduction of electric current and thermal energy in different direction in the layers 202, 204 of the body 102 can be referred to as transverse thermoelectricity properties of the device 100. These properties are based on anisotropic conduction of holes in one direction and electrons in another direction (e.g., in perpendicular directions) resulting in an ambipolar Seebeck tensor in the semiconductor body 102 of the device 100.

With respect to the example of the semiconductor body 102 shown in FIG. 6, the conduction of electric current through the different sections 210, 212, 214 of the semiconductor body 102 results in different transverse flows of the thermal energy. In the end section 210, the conduction of the electric current in a generally upward direction (e.g., from the perspective of FIG. 6) toward the target object 200 results in transverse flow of the thermal energy downwards and away from the target object 200. In the interior section 212, the conduction of the electric current in a direction generally along the conduction angle θ results in transverse flow of the thermal energy in perpendicular directions to the layers. In the other end section 214, the conduction of the electric current in directions that are more parallel to the layers 202, 204 also results in conduction of the thermal energy in directions that are more parallel to the layers 202, 204 and radially away from the target object 200. As a result, the thermal energy is conducted away from the target object 200.

In accordance with one embodiment, the transverse thermoelectric device 100 may cool the target object 200 such that the target object 200 is cooled by at least 14.5 degrees Kelvin (or equivalently 14.5 degrees Celsius). Alternatively, the transverse thermoelectric device 100 may cool the target object 200 by at least 7 degrees Kelvin. In another embodiment, the transverse thermoelectric device 100 may cool the target object 200 by at least 5.3 degrees Kelvin. In another embodiment, the transverse thermoelectric device 100 may cool the target object 200 by at least 4.5 degrees Kelvin. Alternatively, the transverse thermoelectric device 100 can cool the target object 200 by another amount.

The materials used to form the semiconductor bodies described herein may be tailored to provide different band gap structures for the semiconductor bodies. In one embodiment, the thicknesses of the layers used to form the semiconductor bodies can be varied to obtain a desired or designated band gap of the semiconductor body.

Figure 7:
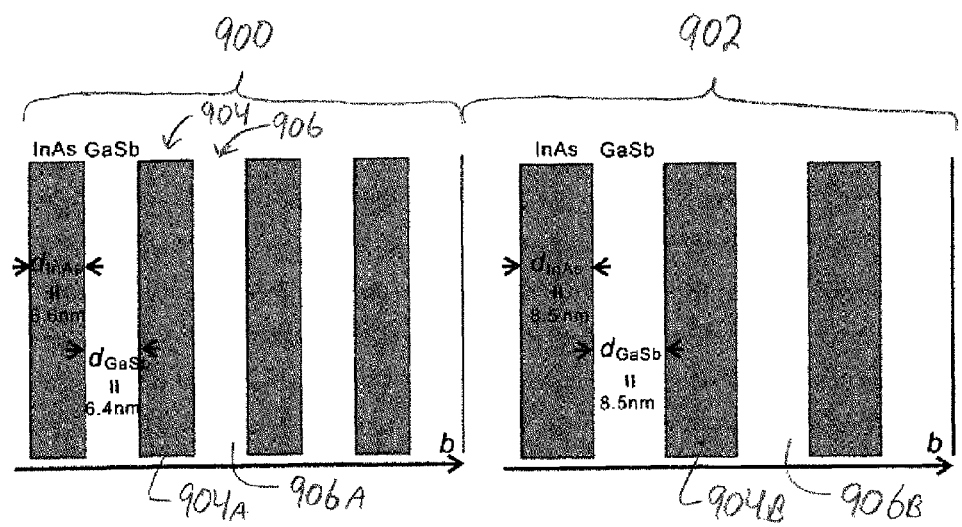
FIG. 7 illustrates two different sequences of layers that create transverse thermoelectric materials in accordance with one embodiment.
Figure 8:
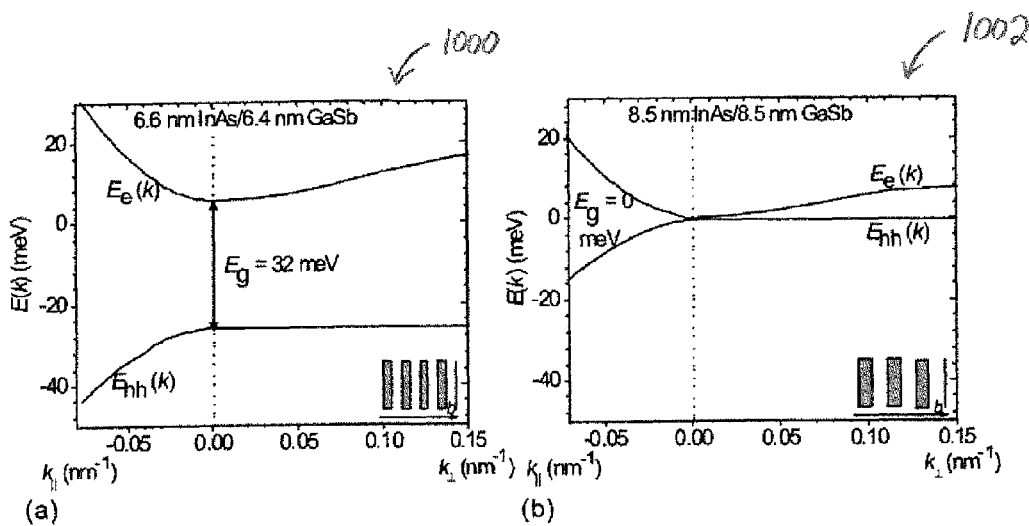
FIG. 8 illustrates examples of two different electronic band structures that result from the layer sequences shown in FIG. 7.

FIG. 7 illustrates two different sequences 900, 902 of layers 904, 906 (e.g., 904A, 904B and 906A, 906B) that create transverse thermoelectric materials in accordance with one embodiment. FIG. 8 illustrates examples of two different electronic band structures 1000, 1002 that result from the layer sequences 900, 902 shown in FIG. 7. The sequences 900, 902 represent two examples of nanoscale layers of alternating InAs and GaSb semiconductor layers 904, 906. Alternatively, one or more other materials may be used. The layers 904, 906 represent the layers in one or more of the semiconductor bodies of the devices described herein. For example, the layers 904, 906 may represent the layers 604, 606 shown in FIG. 2, the layers 804, 806 shown in FIG. 4, and/or the layers 202, 204 shown in FIG. 6.

In the sequence 900, the thicknesses ($d_{InAs}$ and $d_{GaSb}$) of the layers 904A, 906A are 6.6 nanometers (nm) and 6.4 nm for InAs and GaSb, respectively, whereas the layer thicknesses are both 8.5 nm in the sequence 902. The band structures 1000, 1002 shown in FIG. 8 show the calculated energy versus momentum (E vs. k) for the sequences 900, 902, respectively. The E vs. k relation to the left of k=0 in each plot designates energy vs. in-plane momentum $k_\|$. The relation E vs. k to the right of k=0 in each plot designates energy vs. out-of-plane momentum $k_\perp$. The shape of the E vs. k relationships shown in the structures 1000, 1002 allow the Seebeck and electrical conductivity tensors to be calculated for the semiconductor bodies formed from the sequences 900, 902. Calculating the Seebeck tensors can permit a determination of which layer sequence 900, 902 makes a better transverse thermoelectric material of a semiconductor body for a given temperature. For example, a semiconductor body formed from the sequence 900 of layers 904A, 906A has a larger band gap and therefore can perform well at higher temperatures, while a semiconductor body formed from the sequence 902 of the layers 904B, 906B has a smaller band gap and therefore can perform well at lower temperatures.

Figure 9:
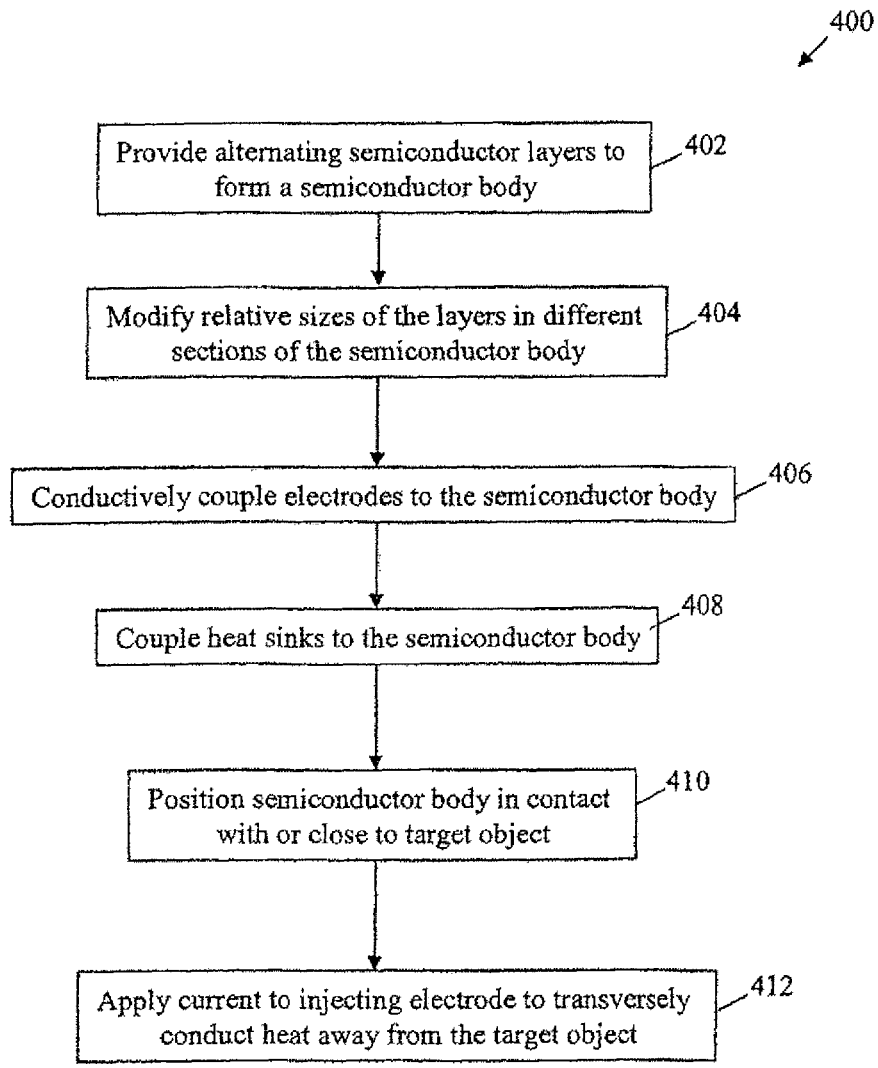
FIG. 9 illustrates a flowchart of one embodiment of a method for manufacturing a transverse thermoelectric device.

FIG. 9 illustrates a flowchart of one embodiment of a method 400 for manufacturing a transverse thermoelectric device. In one embodiment, the method 400 may be used to fabricate the one or more of the transverse thermoelectric devices shown in FIGS. 1 through 6. Alternatively, the method 400 may be used to create another transverse thermoelectric device that operates similar to the transverse thermoelectric device to conduct heat away from a target object when electric current is conducted through the transverse thermoelectric device. In another embodiment, the method 400 may be used to create a transverse thermoelectric device that generates electrical power when a temperature gradient is created in the device.

At 402, several alternating semiconductor layers are deposited or grown on each other. For example, several alternating layers of Type II superlattice materials, such as semiconductor materials having Type II band alignment, and/or materials having anisotropic crystal structures may be deposited or grown directly onto one another to form a semiconductor body having the alternating layers. In one embodiment, the layers may be provided using molecular beam epitaxy. Alternatively, the layers may be provided using metalorganic vapour phase epitaxy (MOCVD), or another technique. As described above, the types of materials used to form the alternating layers and/or the different thicknesses of the alternating layers may be established in order to control the power factor of the transverse thermoelectric device that is formed.

At 404, the relative sizes of one or more of the layers in the semiconductor body can be modified. For example, a subset of the layers in the semiconductor body may be etched or otherwise modified such that the layers in the subset are smaller than one or more other layers. As described above, the layers that are positioned to be located closer to a target object (that is to be cooled by the transverse thermoelectric device formed according to the method 400) may be smaller (e.g., laterally more narrow) than the layers that are disposed farther from the target object. Creating the semiconductor body such that the layers that are closer to the target object are smaller (e.g., more narrow) than the layers that are farther from the target object can result in improved cooling of the target object relative to semiconductor bodies formed from differently sized layers, such as bodies having all layers being the same size. Alternatively, the sizes of the layers may not be modified. For example, the method 400 may omit 404, where the sizes of one or more layers are left unchanged or are changed, but the layers are kept at a common size to produce a device such as the rectangular shaped device described above.

At 406, contacts are conductively coupled with the semiconductor body. The contacts can include the injecting contact and the receiving contact that are coupled to different surfaces of the semiconductor body. The contacts may be positioned on the semiconductor body relative to each other in order to create a conduction angle θ between the contacts relative to the superlattice layer in the semiconductor body. As described above, this conduction angle θ can be established to increase the transverse power factor ($PF_\perp$), such as how efficient the transverse thermoelectric device is at cooling the target body. The injecting contact may be coupled with a power source, such as a battery or other source of electric current, and the receiving contact may be coupled with a ground reference or other relatively low potential energy device such that the current that is applied to the injecting contact is conducted through the semiconductor body to the receiving contact.

At 408, one or more heat sinks are coupled to the semiconductor body. The heat sinks may be connected to the semiconductor body in locations that are disposed away from the target object, and in locations toward where the heat is directed from the target body. For example, the heat sinks can be electrically insulating, but thermally conductive, bodies joined to the outer surfaces of the semiconductor body that extend between the ends of the semiconductor body (to which the contacts are connected). Alternatively, the heat sinks may not be joined to the semiconductor body.

At 410, the transverse thermoelectric device is positioned in contact with or relatively close to the target object. For example, the semiconductor body may be placed into direct contact with the target object. The semiconductor body may include a receiving area in which the target object (or at least a portion thereof) is placed into contact. Alternatively, the device may not be placed in contact with or near the target object, such as when the device is used to generate electrical power by creating a temperature gradient in the device.

At 412, electric current is applied to at least one of the contacts. The current is conducted through the semiconductor body to another contact. As described above, the conduction of the current through the semiconductor body along a path that extends from the injecting contact to the receiving contact causes the thermal energy (e.g., heat) to be conducted away from the target object in one or more transverse directions. The heat can be conducted away from the target object in order to cool the target object (or at least a portion thereof). In another embodiment, at 412, a temperature gradient is created in the device. For example, one or more sides of the semiconductor body in the device may be exposed to a source of heat. This exposure may cause one side of the body to be hotter relative to another side of the body. This difference in temperature can create a temperature gradient across the body and induce heat flow. The heat flow can create an electric current and corresponding voltage difference in one or more transverse directions, such as along the conduction angle of the body. The electric power can be extracted from the body 102, such as by coupling leads to the contacts. The electric power may then be stored and/or used to assist in powering one or more loads.

Figure 10:
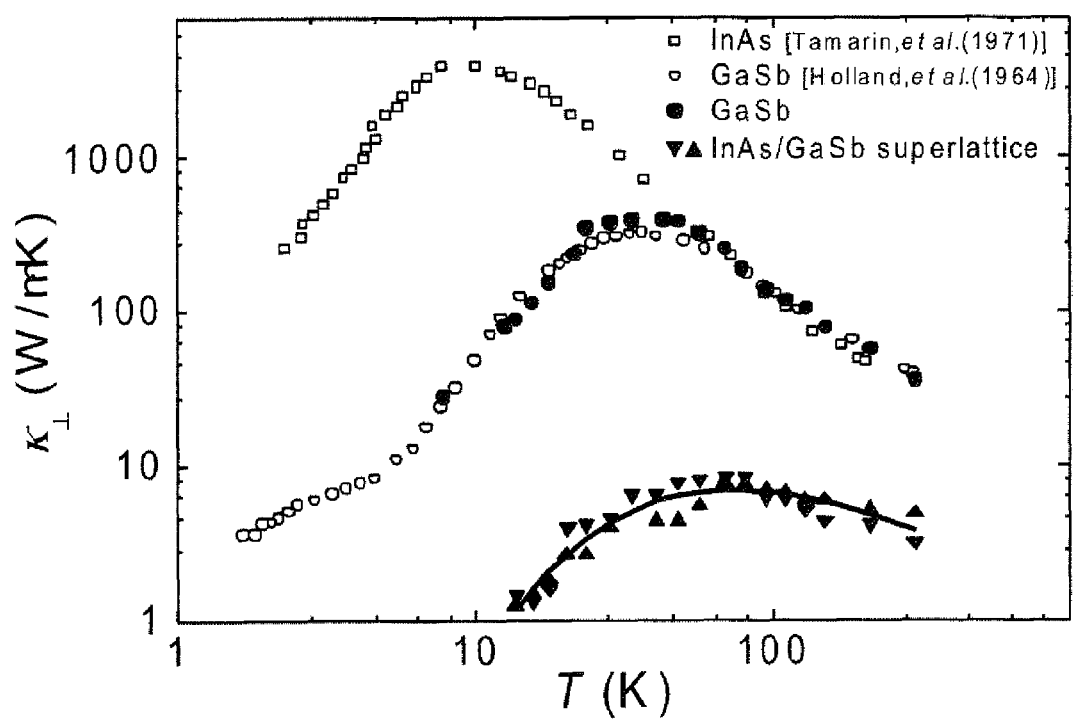
FIG. 10 illustrates examples of thermal conductivity of a superlattice material used to form one or more of the semiconductor bodies described herein.

FIG. 10 illustrates examples of thermal conductivity of a superlattice material used to form one or more of the semiconductor bodies described herein. FIG. 10 shows an observed thermal conductivity of 4 W/(m*K) at room temperature (294 K or 21° C.) for an InAs/GaSb superlattice structure formed in accordance with one or more embodiments described herein. Other data in FIG. 10 demonstrate how the InAs/GaSb superlattice thermal conductivity can be up to 3 orders of magnitude less than InAs or GaSb alone.

In one embodiment, a transverse thermoelectric device includes a superlattice body, electrically conductive first and second contacts, and first and second thermal contacts. The superlattice body extends between opposite first and second ends along a first direction and between opposite first and second sides along a different, second direction. The superlattice body includes alternating first and second layers of crystalline materials oriented at an oblique angle relative to the first direction. The electrically conductive first contact is coupled with the first end of the superlattice and the electrically conductive second contact is coupled with the second end of the superlattice. The first thermal contact is thermally coupled to the first side of the superlattice and the second thermal contact is thermally coupled to the second side of the superlattice. A Seebeck tensor of the superlattice body is ambipolar.

In one aspect, the first and second layers are formed from crystalline semiconductor materials.

In one aspect, the superlattice body generates a voltage difference between the electrically conductive first contact and the electrically conductive second contact when the superlattice body is exposed to an applied temperature difference between the first thermal contact and second thermal contact.

In one aspect, the superlattice body conducts an electrical current between the first and second electrically conductive contacts in response to the applied temperature difference between the first thermal contact and second thermal contact.

In one aspect, the alternating first and second layers are made from materials chosen from the group consisting of Indium Arsenide, Gallium Antimonide, and Indium Arsenide Antimonide.

In one aspect, the first direction and the second direction are substantially perpendicular to each other.

In one aspect, the superlattice body generates a heat flow between the first thermal contact and the second thermal contact in response to an applied electrical current between the electrically conductive first contact and the electrically conductive second contact.

In one aspect, the superlattice body induces a temperature difference between the first thermal contact and the second thermal contact in response to the applied electrical current between the first and second electrically conductive contacts.

In one aspect, the oblique angle is greater than 20 degrees and less than 70 degrees.

In one aspect, electric current is not extracted from the superlattice body through one or more of the thermal contacts and electric current is not injected into the superlattice body through one or more of the thermal contacts.

In one aspect, the Seebeck tensor is defined by the equation $Q=(ST)J$, wherein S is the Seebeck tensor of the superlattice body, Q is a heat flow density of the superlattice body due to an electric current injected into the superlattice body, T is a temperature of the superlattice body, and J is an electric current density of the superlattice body.

In one embodiment, a method for manufacturing a transverse thermoelectric device includes providing alternating first and second layers of semiconductor materials to form a superlattice body extending between opposite first and second ends along a first direction, and between opposite first and second sides along a different, second direction. The superlattice body includes alternating first and second layers of crystalline materials oriented at an oblique angle relative to the first direction. The method also includes coupling a first electrically conductive contact with the first end of the superlattice body, coupling a second electrically conductive contact with the second end of the superlattice body, coupling a first thermal contact to the first side of the superlattice body, and coupling a second thermal contact to the second side of the superlattice body. The alternating first and second layers are oriented at an oblique angle relative to the first direction and a Seebeck tensor of the superlattice body is ambipolar.

In one aspect, the alternating first and second layers are made from materials chosen from the group consisting of Indium Arsenide, Gallium Antimonide, and Indium Arsenide Antimonide.

In one aspect, the first direction and the second direction are substantially perpendicular to each other.

In one aspect, the oblique angle is greater than 20 degrees and less than 70 degrees.

In one aspect, the method also includes doping the alternating first or second layers of semiconductor material.

In one aspect, providing the alternating first and second layers includes growing the alternating first and second layers using a crystal growth process, and the doping of the alternating first or second layers compensates for background doping that occurs during a crystal growth process, or the doping of the alternating first or second layers increases anisotropy of the Seebeck tensor.

In one embodiment, a transverse thermoelectric device includes a semiconductor body and first and second conductive contacts. The semiconductor body extends between opposite first and second ends along a first direction and between opposite first and second sides along a different, second direction. The semiconductor body includes alternating first and second layers of crystalline semiconductor materials. The first contact is coupled with the first end of the semiconductor body and the second contact is coupled with the second end of the semiconductor body. The first side of the semiconductor body is configured to be heated while the second side is cooler than the first side such that a temperature gradient is created through the semiconductor body between the first and second sides and along the second direction. The semiconductor body creates an electric current and corresponding voltage difference that is along the first direction between the first and second contacts responsive to the temperature gradient being created in the semiconductor body.

In another aspect, the semiconductor body includes a superlattice structure formed from several sets of the alternating first and second layers of the semiconductor material.

In another aspect, the alternating first and second layers are obliquely angled with respect to at least one of the first direction or the second direction.

In another aspect, the first layers of the semiconductor body are formed from a different semiconductor material than the second layers of the semiconductor body.

In another aspect, the first layers are formed from indium arsenide or indium arsenide (InAs) and the second layers are formed from gallium antimonide) GaSb.

In another aspect, the semiconductor body extends between third and fourth sides along a third direction and has a tapered shape such that a width dimension of the semiconductor body along the third direction is wider at the second side than at the first side of the semiconductor body.

In another aspect, the first and second contacts are coupled to the semiconductor body such that a conduction path that extends from the first contact to the second contact and along which the electric current is conducted within the semiconductor body is obliquely oriented at a conduction angle with respect to at least one of the first direction or the second direction.

In another aspect, a power factor of the semiconductor body represents an efficiency in which the first and second layers conduct the electric current in a transverse direction to the temperature gradient. The power factor is dependent upon the conduction angle such that changes in the conduction angle change the power factor of the semiconductor body.

In one embodiment, a transverse thermoelectric device includes a semiconductor body and first and second conductive contacts. The semiconductor body extends between opposite first and second ends along a first direction and between opposite first and second sides along a different, second direction. The semiconductor body includes alternating first and second layers of crystalline semiconductor materials. The first contact is coupled with the first end of the semiconductor body and the second contact is coupled with the second end of the semiconductor body. The semiconductor body is configured to conduct an electric current along a conduction path extending from the first contact to a second contact along a conduction direction, and the semiconductor body is configured to conduct heat along a different, transverse direction in response to the electric current being conducted such that the heat is conducted away from the second side toward the first side.

In another aspect, the semiconductor body includes a superlattice structure formed from several sets of the alternating first and second layers of the semiconductor material.

In another aspect, the alternating first and second layers are obliquely angled with respect to at least one of the first direction or the second direction.

In another aspect, the first layers are formed from indium arsenide (InAs) and the second layers are formed from gallium antimonide (GaSb).

In another aspect, the semiconductor body extends between third and fourth sides along a third direction and has a tapered shape such that a width dimension of the semiconductor body along the third direction is wider at the second side than at the first side of the semiconductor body.

In another aspect, the first and second contacts are coupled to the semiconductor body such that the conduction path that extends from the first contact to the second contact and along which the electric current is conducted within the semiconductor body is obliquely oriented at a conduction angle with respect to at least one of the first direction or the second direction.

In another aspect, a transverse power factor of the semiconductor body represents an efficiency in which the body of alternating first and second layers conducts the heat in a transverse direction to the conduction path. The transverse power factor is dependent upon the conduction angle such that changes in the conduction angle change the power factor of the semiconductor body.

In one embodiment, a method for manufacturing a transverse thermoelectric transverse thermoelectric device is provided. The method includes depositing alternating first and second layers of semiconductor materials to form a semiconductor body extending between opposite first and second ends and conductively coupling a receiving contact with the second end of the semiconductor body. The method also includes conductively coupling an injecting contact with the first end of the semiconductor body. The second end of the semiconductor body is coupled with the semiconductor body at or near a receiving area of the semiconductor body that is configured to receive a target object and the semiconductor body is configured to conduct electric current through the alternating first and second layers along a conduction path extending from the injecting contact to the receiving contact. The first and second layers of the semiconductor body are configured to conduct heat from the target object through the alternating first and second layers of the semiconductor body in one or more transverse directions that are obliquely oriented with respect to the conduction path in response to the electric current being conducted along the conduction path.

In another aspect, the alternating first and second layers are deposited as a superlattice structure.

In another aspect, the method includes removing portions of one or more of the alternating first and second layers such that the first and second layers are larger in a first section of the semiconductor body than in a second section of the semiconductor body such that the first section of the semiconductor body is located closer to the target object than the second section of the semiconductor body.

In another aspect, the receiving contact that is coupled with the semiconductor body includes an annular conductive ring disposed around the receiving area of the semiconductor body.

In another aspect, the injecting contact and the receiving contact are coupled to the semiconductor body such that the electrical conduction path that extends from the injecting contact to the receiving contact is obliquely oriented at a conduction angle with respect to the first and second layers.

An efficiency at which the semiconductor body thermally conducts the heat from the target object is based on the conduction angle.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the inventive subject matter without departing from its scope. While relative dimensions described herein are intended to define the parameters of the inventive subject matter, they are by no means limiting and are example embodiments. Many other embodiments will be apparent to one of ordinary skill in the art upon reviewing the above description. The scope of the inventive subject matter should, therefore, be determined with reference to the appended clauses, along with the full scope of equivalents to which such clauses are entitled. In the appended clauses, the terms "including" and "in which" are used as the plain-English equivalents of the respective terms "comprising" and "wherein." Moreover, in the following clauses, the terms "first," "second," and "third," etc. are used merely as labels, and are not intended to impose numerical requirements on their objects. Further, the limitations of the following clauses are not written in means-plus-function format and are not intended to be interpreted based on 35 U.S.C. §112, sixth paragraph, unless and until such clause limitations expressly use the phrase "means for" followed by a statement of function void of further structure.

The foregoing description of certain embodiments of the present inventive subject matter will be better understood when read in conjunction with the appended drawings. To the extent that the figures illustrate diagrams of the functional blocks of various embodiments, the functional blocks are not necessarily indicative of the division between hardware circuitry. The various embodiments are not limited to the arrangements and instrumentality shown in the drawings.

The invention claimed is:

1. A transverse thermoelectric device comprising:
    a superlattice body extending between opposite first and second ends along a first direction and between opposite first and second sides along a different, second direction, the superlattice body comprising alternating first and second layers of crystalline materials oriented at an oblique angle relative to the first direction;
    an electrically conductive first contact coupled with the first end of the superlattice;
    an electrically conductive second contact coupled with the second end of the superlattice;
    a first thermal contact thermally coupled to the first side of the superlattice; and
    a second thermal contact thermally coupled to the second side of the superlattice;
    wherein a Seebeck tensor of the superlattice body is ambipolar.

2. The transverse thermoelectric device of claim 1, wherein the superlattice body generates a voltage difference between the electrically conductive first contact and the electrically conductive second contact when the superlattice body is exposed to an applied temperature difference between the first thermal contact and second thermal contact.

3. The transverse thermoelectric device of claim 2, wherein the superlattice body conducts an electrical current between the first and second electrically conductive contacts in response to the applied temperature difference between the first thermal contact and second thermal contact.

4. The transverse thermoelectric device of claim 2, wherein the alternating first and second layers are made from materials chosen from the group consisting of Indium Arsenide, Gallium Antimonide, and Indium Arsenide Antimonide.

5. The transverse thermoelectric device of claim 2, wherein the first direction and the second direction are substantially perpendicular to each other.

6. The transverse thermoelectric device of claim 1, wherein the superlattice body generates a heat flow between the first thermal contact and the second thermal contact in response to an applied electrical current between the electrically conductive first contact and the electrically conductive second contact.

7. The transverse thermoelectric device of claim 6, wherein the superlattice body induces a temperature difference between the first thermal contact and the second thermal contact in response to the applied electrical current between the first and second electrically conductive contacts.

8. The transverse thermoelectric device of claim 6, wherein the alternating first and second layers are made from materials chosen from the group consisting of Indium Arsenide, Gallium Antimonide, and Indium Arsenide Antimonide.

9. The transverse thermoelectric device of claim 6, wherein the first direction and the second direction are substantially perpendicular to each other.

10. The transverse thermoelectric device of claim 1, wherein the oblique angle is greater than 20 degrees and less than 70 degrees.

11. The transverse thermoelectric device of claim 1, wherein electric current is not extracted from the superlattice body through one or more of the thermal contacts and electric current is not injected into the superlattice body through one or more of the thermal contacts.

12. The transverse thermoelectric device of claim 1, wherein the Seebeck tensor is defined by the equation $Q=(ST)J$, wherein S is the Seebeck tensor of the superlattice body, Q is a heat flow density of the superlattice body due to an electric current injected into the superlattice body, T is a temperature of the superlattice body, and J is an electric current density of the superlattice body.

13. A method for manufacturing a transverse thermoelectric device, the method comprising:
    providing alternating first and second layers of semiconductor materials to form a superlattice body extending between opposite first and second ends along a first direction, and between opposite first and second sides along a different, second direction, the superlattice body comprising alternating first and second layers of crystalline materials oriented at an oblique angle relative to the first direction;
    coupling a first electrically conductive contact with the first end of the superlattice body;
    coupling a second electrically conductive contact with the second end of the superlattice body;
    coupling a first thermal contact to the first side of the superlattice body; and
    coupling a second thermal contact to the second side of the superlattice body;
    wherein a Seebeck tensor of the superlattice body is ambipolar.

14. The method of claim 13, wherein the alternating first and second layers are made from materials chosen from the group consisting of Indium Arsenide, Gallium Antimonide, and Indium Arsenide Antimonide.

15. The method of claim 13, wherein the first direction and the second direction are substantially perpendicular to each other.

16. The method of claim 13, wherein the oblique angle is greater than 20 degrees and less than 70 degrees.

17. The method of claim 13, further comprising doping the alternating first or second layers of semiconductor material.

18. The method of claim 17, wherein providing the alternating first and second layers includes growing the alternating first and second layers using a crystal growth process, and doping the alternating first or second layers compensates for background doping that occurs during a crystal growth process, or doping the alternating first or second layers increases anisotropy of the Seebeck tensor.

* * * * *